(12) United States Patent
Sakurai et al.

(10) Patent No.: US 8,120,188 B2
(45) Date of Patent: Feb. 21, 2012

(54) ELECTRONIC COMPONENT MOUNTING STRUCTURE AND METHOD FOR MANUFACTURING THE SAME

(75) Inventors: Daisuke Sakurai, Osaka (JP); Yoshihiko Yagi, Hyogo (JP)

(73) Assignee: Panasonic Corporation, Osaka (JP)

( * ) Notice: Subject to any disclaimer, the term of this patent is extended or adjusted under 35 U.S.C. 154(b) by 283 days.

(21) Appl. No.: 12/515,425

(22) PCT Filed: Nov. 20, 2007

(86) PCT No.: PCT/JP2007/072422
§ 371 (c)(1),
(2), (4) Date: May 19, 2009

(87) PCT Pub. No.: WO2008/065926
PCT Pub. Date: Jun. 5, 2008

(65) Prior Publication Data
US 2010/0052189 A1 Mar. 4, 2010

(30) Foreign Application Priority Data

Nov. 28, 2006 (JP) .................................. 2006-319838
Nov. 30, 2006 (JP) .................................. 2006-323380

(51) Int. Cl.
*H01L 23/485* (2006.01)
(52) U.S. Cl. .......... 257/778; 257/E23.019; 257/E21.511
(58) Field of Classification Search .................. 257/108, 257/778, E21.511, E23.019; 438/108, 597
See application file for complete search history.

(56) References Cited

U.S. PATENT DOCUMENTS

| | | | | |
|---|---|---|---|---|
| 5,846,853 | A | * | 12/1998 | Otsuki et al. .................. 438/119 |
| 7,524,748 | B2 | | 4/2009 | Fujimoto et al. |
| 7,799,607 | B2 | | 9/2010 | Karashima et al. |
| 2007/0001313 | A1 | * | 1/2007 | Fujimoto et al. .............. 257/778 |
| 2008/0135283 | A1 | | 6/2008 | Hibino et al. |

FOREIGN PATENT DOCUMENTS

| | | |
|---|---|---|
| JP | 03-252197 | 11/1991 |
| JP | 04-003992 | 1/1992 |
| JP | 05-021519 | 1/1993 |
| JP | 5-90269 | 4/1993 |
| JP | 5-326524 | 12/1993 |
| JP | 06-151438 | 5/1994 |
| JP | 8-191072 | 7/1996 |

(Continued)

OTHER PUBLICATIONS

International Search Report issued Feb. 19, 2008 in the International (PCT) Application of which the present application is the U.S. National Stage.

*Primary Examiner* — N Drew Richards
*Assistant Examiner* — Mamadou Diallo
(74) *Attorney, Agent, or Firm* — Wenderoth, Lind & Ponack, L.L.P.

(57) ABSTRACT

An electronic component mounting structure includes an electronic component provided with a plurality of electrode terminals, and a mounting substrate provided with connector terminals in positions corresponding to the electrode terminals. An electrode terminal is connected to a connector terminal via a protrusion electrode disposed on the electrode terminal or the connector terminal, and the protrusion electrode includes a conductive filler and a photosensitive resin. The photosensitive resin varies in resin component crosslink density in the height direction of the protrusion electrode.

10 Claims, 16 Drawing Sheets

FOREIGN PATENT DOCUMENTS

| | | |
|---|---|---|
| JP | 11-214447 | 8/1999 |
| JP | 2001-156091 | 6/2001 |
| JP | 2001-189337 | 7/2001 |
| JP | 2001-217281 | 8/2001 |
| JP | 2004-260131 | 9/2004 |
| JP | 2005-303181 | 10/2005 |
| JP | 2006-100775 | 4/2006 |
| JP | 2006-302929 | 11/2006 |
| WO | 99/65075 | 12/1999 |

* cited by examiner

ELECTRONIC COMPONENT MOUNTING STRUCTURE AND METHOD FOR MANUFACTURING THE SAME

TECHNICAL FIELD

The present invention relates to an electronic component mounting structure with an electronic component and a mounting substrate, and its manufacturing method.

BACKGROUND ART

With a recent trend of mobile equipment increasingly becoming higher in performance and smaller in size, electronic circuit devices are required to be larger in memory capacity, higher in performance, and smaller in size. Accordingly, there is a strong demand for high-density mounting based on finer and narrower pitch wiring rules for semiconductor elements.

Conventionally, flip-chip mounting technology is available as a technology for high-density mounting of electronic components such as semiconductor elements on various wiring boards.

In ordinary flip-chip mounting, for example, a solder bump of about 100 μm in diameter is formed on an electrode terminal of a semiconductor element such as LSI. After that, the semiconductor element is press-fitted and heated to connect the bump to a connector terminal of the mounting substrate by a face-down bonding method.

However, in such a mounting technology with use of a solder bump, a high pressing force is required for press-fitting in the mounting step, causing a great load to be applied to the semiconductor element. Therefore, in the case of recently available semiconductor element reduced in size having Low-K dielectric layer, there arises a problem such as breakdown of fragile dielectric layer, element breakage, or variation of semiconductor element characteristics.

As a technology for solving the above problem, a semiconductor device with a stress absorbing ball formed of polymer ball having a conductive member on the surface thereof arranged between an electrode terminal of the semiconductor element and a connector terminal of the wiring board and with a conductive member connected to the electrode terminal and connector terminal by diffusion bonding is disclosed (for example, refer to Patent document 1). In this way, connection trouble can be decreased because stresses generated in the press-fitting and heating step are absorbed by the stress absorbing ball, and electrical resistance can be reduced by diffusion bonding.

On the other hand, a method of exposing and developing a predetermined portion of a semiconductor element coated with solder particle photosensitive resin that is photosensitive resin containing solder particles is disclosed as a method of forming a solder bump (for example, refer to Patent document 2). In this way, a solder bump with solder particles diffused in the resin can be formed with excellent productivity. Also, bump connection can be performed by pressing the semiconductor element against the wiring board by means of a clamp.

However, in the semiconductor device of Patent document 1, there arises such a problem that the manufacturing cost becomes higher for forming a smaller-sized stress absorbing ball having a conductive member on the surface thereof. Also, a bump electrode is formed by arranging a small-sized stress absorbing ball on the electrode terminal, and in this method, it is difficult to make the arrangement corresponding to the size reduced, making it difficult to realize high-density mounting.

Also, in the solder bump forming method of Patent document 2, since it is a mounting structure such that contact connection is made by pressing the solder bump having solder particles diffused in the resin and solder particles contacting with each other, there arises a problem such as generation of great electrical resistance and worsening of connection reliability.

Patent document 1: Unexamined Japanese Patent Publication H5-21519

Patent document 2: Unexamined Japanese Patent Publication H5-326524.

BRIEF SUMMARY OF THE INVENTION

The electronic component mounting structure of the present invention comprises an electronic component provided with a plurality of electrode terminals, and a mounting substrate provided with connector terminals facing the electrode terminals, wherein the electrode terminal is connected to the connector terminal via a protrusion electrode disposed on the electrode terminal or the connector terminal, and the protrusion electrode includes at least conductive filler and photosensitive resin, and the photosensitive resin varies in resin component crosslink density in a height direction of the protrusion electrode.

Accordingly, it enables mounting with a low pressure at a portion where the photosensitive resin of the protrusion electrode is low in resin component crosslink density and absorbing stresses in application of the pressure, making it possible to improve the connection reliability and to efficiently prevent breakdown of the electronic component. Also, in connecting operation, fusion adhering of the conductive filler takes place at a portion of being low in resin component crosslink density of photosensitive resin, causing it to be metalized, and since the conductive fillers at a portion of being high in resin component crosslink density are in a state of contacting with each other, it is possible to decrease the connection resistance. Further, due to the portion of high resin component crosslink density, the strength of connection to the mounting substrate or semiconductor element increases and it is possible to realize an electronic component mounting structure which ensures excellent adhesion. Also, since fine protrusion electrodes can be formed by using photosensitive resin, it is possible to manufacture an electronic component mounting structure capable of meeting the requirement for narrower pitches.

Also, the manufacturing method for electronic component mounting structure of the present invention includes a protrusion electrode forming step for forming a protrusion electrode on an electrode terminal of the electronic component or a connector terminal of the mounting substrate, and a connecting step for connecting the electrode terminal to the connector terminal via the protrusion electrode, wherein the protrusion electrode forming step includes a step of feeding photosensitive resin containing conductive filler on the surface of the electronic component or the mounting substrate, a step of exposing the photosensitive resin at a position corresponding to the electrode terminal or the connector terminal, a step of forming the photosensitive resin varying in polymerization degree in the height direction of protrusion electrode, a step of removing unexposed portions of the photosensitive resin, and a step of making it porous at a portion where the photosensitive resin is at least low in polymerization degree, and the connecting step includes a step of positioning the electrode terminal to the connector terminal via the protrusion electrode with respect to the electronic component formed with protrusion electrode or the mounting substrate, and a step of connecting the electrode terminal to the connector terminal by press-fitting and heating at least one of the electronic component and the mounting substrate.

Thus, it is possible to absorb stresses in the press-fitting step by making a portion being low in resin component crosslink density structurally porous, enabling the mounting with low pressing forces in the connecting operation, and it is possible to easily prevent breakdown of semiconductor element or generation of characteristic change. Also, conductive fillers at a portion of low resin component crosslink density of photosensitive resin are subjected to fusion-adhering (metalizing) and conductive fillers at a portion of high resin component crosslink density are subjected to contacting with each other, and therefore, the connection can be realized with low connection resistance. Also, since fine protrusion electrodes can be formed by using photosensitive resin, it is possible to manufacture an electronic component mounting structure capable meeting the requirement for narrower pitches at low costs.

Also, the manufacturing method for electronic component mounting structure of the present invention includes a step of arranging a mounting substrate including a connector terminal formed from transparent conductive film formed on a transparent substrate surface and an electronic component provided with an electrode terminal in a position corresponding to the connector terminal at a predetermined interval and feeding photosensitive resin including conductive filler between the electronic component and the mounting substrate, a step of forming a protrusion electrode varying in polymerization degree of photosensitive resin in the direction of height between the connector terminal and the electrode terminal by applying light while continuously changing the intensity of light via an opening of a photo-mask from the opposite side of a surface facing to the electronic component of the mounting substrate, a step of removing unexposed portions of photosensitive resin, a step of making it porous at a portion at least being low in polymerization degree of photosensitive resin, and a step of connecting the electrode terminal to the connector terminal by press-fitting and heating at least one of the electronic component and the mounting substrate.

In this way, protrusion electrodes varying in resin component crosslink density of photosensitive resin in the direction of height can be formed all together at predetermined intervals between the transparent connector terminal of the transparent mounting substrate and the electrode terminal of the electronic component. Accordingly, the steps of connecting the electronic component to the mounting substrate and forming the protrusion electrode can be performed at the same time, and it is possible to efficiently manufacture the electronic component mounting structure at low costs.

Figure 1:
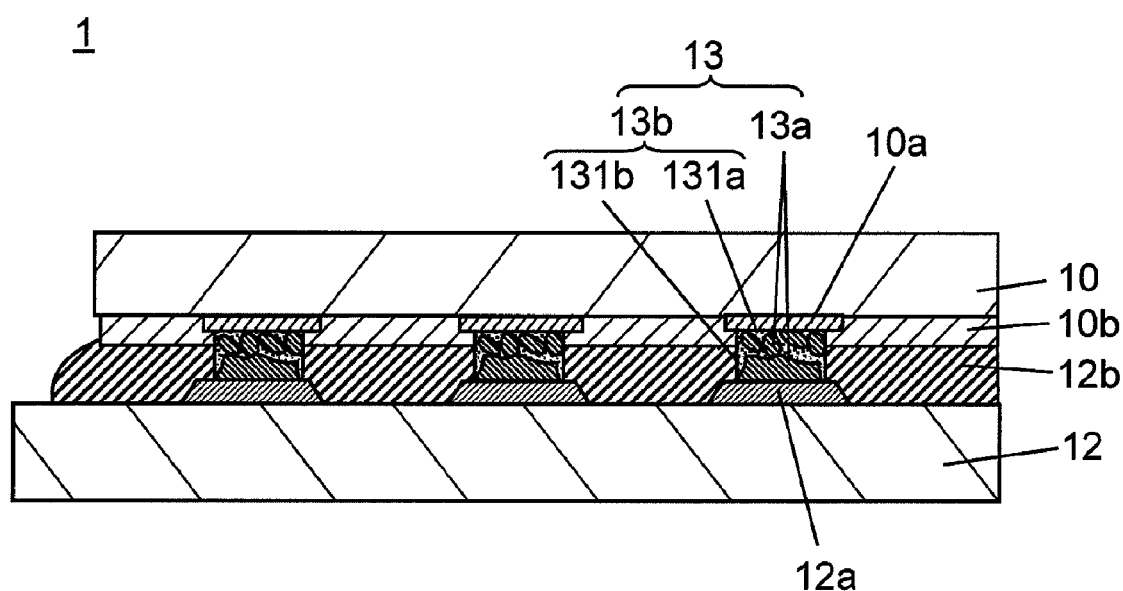
FIG. 1 is a conceptual cross-sectional view showing a configuration of an electronic component mounting structure in a first preferred embodiment of the present invention.

DESCRIPTION OF REFERENCE MARKS 1, 2, 3, 4, 5 Electronic component mounting structure
10 Electronic component
10a, 101a, 102, 103 Electrode terminal
10b Insulating protective film
12, 112, 201 Mounting substrate
12a, 112a, 202 Connector terminal
12b Insulating resin layer
13, 43, 63, 83, 93, 113, 203 Protrusion electrode
13a, 206, 222 Conductive filler
13b, 43b, 63b, 83b, 113b, 207, 221 Photosensitive resin
30 Pre-protrusion electrode
30a, 931a, 1031a Photosensitive resin portion of high polymerization degree
30b, 931b, 1031b Photosensitive resin portion of low polymerization degree
31, 51, 61, 71, 231 Container
31a, 51a, 61a Bottom surface
33 Photosensitive resin liquid
33c Unexposed portion
34, 54, 64, 74 Photo-mask
34a, 94a, 104a, 226, 226a, 226b Opening
34b, 640b Liquid crystal layer
34c, 640c Transparent substrate
54a, 64a, 74a First opening
54b, 64b, 74b Second opening
104 Dummy bump
131a, 831a, 1131a High resin component crosslink density portion
131b, 831b, 1131b Low resin component crosslink density portion
204 Conductive post
204a, 204b Cured portion
205 Conductive metal layer
223 Convection generator agent
223a Gas
224 Photosensitive conductive resin composition (conductive paste)
225 Liquid crystal mask
227 Ultraviolet ray
228, 261 Dry ice
229 Protective layer
231a Peripheral wall
231b Bottom portion
262 Micro-crack
263 Expansion
331a, 336a First layer of high polymerization degree
332b, 337b Second layer of low polymerization degree
431a, 631a First layer
432b, 632b Second layer
830 Protrusion electrode portion

DETAILED DESCRIPTION OF THE INVENTION

The preferred embodiments of the present invention will be described in the following with reference to the drawings. In the following preferred embodiments, same components and same portions are provided with same reference marks in the description.

First Preferred Embodiment

FIG. 1 is a conceptual cross-sectional view showing the configuration of an electronic component mounting structure in the first preferred embodiment of the present invention.

As shown in FIG. 1, electronic component mounting structure 1 comprises electronic component 10 having a plurality of electrode terminals 10a which is connected to mounting substrate 12 having connector terminals 12a facing to electrode terminals 10a by means of protrusion electrodes 13. In this case, electrode terminal 10a and connector terminal 12a are connected to each other in a fusion adhering or contacting fashion via protrusion electrode 13.

Also, protrusion electrode 13 includes at least conductive filler 13a and photosensitive resin 13b. Further, protrusion electrode 13 has such a structure that the resin component crosslink density of photosensitive resin 13b varies in the height direction of protrusion electrode 13. In this preferred embodiment, electrode terminal 10a of electronic component 10 is connected to connector terminal 12a of mounting substrate 12 by means of protrusion electrode 13 which is configured in that conductive filler 13a fusion-adheres to each other at low resin component crosslink density portion 131b, and conductive fillers 13a come in contact with each other at high resin component crosslink density portion 131a.

In the present preferred embodiment, protrusion electrode 13 is disposed on electrode terminal 10a of electronic component 10, and the resin component crosslink density of photosensitive resin 13b continuously varies over the height direction of protrusion electrode 13 from high resin component crosslink density portion 131a in the vicinity of electrode terminal 10a to low resin component crosslink density portion 131b.

As a result, low resin component crosslink density portion 131b of protrusion electrode 13 is structurally porous and flexible having a cushioning effect, which is therefore able to reduce stresses generated due to pressing forces in the press-fitting step in mounting operation. Also, protrusion electrode 13 can be easily deformed with a low pressing force and it is possible to make reliable connection and to prevent breakdown of the electronic component or the like caused due to pressing forces.

Also, in the present preferred embodiment, insulating resin layer 12b is further disposed between electronic component 10 and mounting substrate 12. In this way, the surrounding area of a portion connected by protrusion electrode 13 is protected and secured by insulating resin layer 12b and it is possible to enhance the reliability of moisture resistance. Also, since the adhesion between electronic component 10 and mounting substrate 12 is enhanced, it is possible to greatly enhance the reliability of impact resistance and drop-shock resistance.

It is not shown, but it is allowable to dispose an anisotropic conductive resin layer instead of insulating resin layer 12b. Thus, it is possible to obtain similar effects as in insulating resin layer 12b and to make connection between connector terminal 12a and electrode terminal 10a around protrusion electrode 13. As a result, it is possible to further reduce the connection resistance due to expansion of the connection area.

Electronic component 10 has a function element such as a semiconductor element and large-capacity memory element in a high-density integrated circuit, for example, LSI chip. Electrode terminal 10a of electronic component 10 is an opening for example with partially exposed wiring (not shown) pattern-formed to enable the area bump arrangement under insulating resin layer 10b, and for example, Ni barrier layer (not shown) is formed on Al electrode. In this case, it is also allowable to properly employ metals having excellent wettability such as Au and Cu as materials for electrode terminals, and Ti, Cr, and W as metals for barrier layers.

Further, connector terminal 12a of mounting substrate 12 is disposed, for example, in a part of the wiring (not shown) formed from a metal such as Au, Ni, Cu on an aramid or glass epoxy multi-layered substrate.

In this case, as the material for mounting substrate 12, it is allowable to use a ceramic material or single crystal silicone material besides the resin material. Also, it is allowable to use a transparent substrate including connector terminals formed from transparent conductive film formed on the transparent material surface.

Also, protrusion electrode 13 is, for example, formed from photosensitive resin 13b such as photosensitive epoxy resin that includes conductive filler 13a formed from solder particles of low melting point such as Sn—Ag—In based alloy. And, photosensitive resin 13b varies in resin component crosslink density in the height (connecting) direction of protrusion electrode 13, and at low resin component crosslink density portion 131b, conductive filler 13a fusion-adheres to each other and metalized in the mounting step. Further, conductive filler 13a fusion-adhered and metalized is electrically connected by soldering to the interface of connector terminal 12a Also, at high resin component crosslink density portion 131a, conductive filler 13a is electrically connected to electrode terminal 10a in a state of at least contacting with each other, and because of high resin component crosslink density, it is secured with high adhesion on the interface of electrode terminal 10a.

Thus, protrusion electrode 13 varies in resin component crosslink density in the height (connecting) direction, and it becomes possible to execute press-fitting with a low pressing force in the manufacturing method of electronic component mounting structure described later. As a result, the stress generated in making connection between electronic component 10 and mounting substrate 12 can be reduced or absorbed, and thereby, it is possible to realize electronic component mounting structure 1 which is excellent in reliability and rather free from breakdown of electronic component 10 and deterioration of characteristics.

As conductive filler 13a, it is allowable to use at least one kind of solder alloy selected from Sn—Ag—In based alloy, Sn—Pb based alloy, Sn—Ag based alloy, Sn—Ag—Bi based alloy, Sn—Ag—Bi—Cu based alloy, Sn—Ag—In—Bi based alloy, Zn—In based alloy, Ag—Sn—Cu based alloy, Sn—Zn—Bi based alloy, In—Sn based alloy, In—Bi—Sn based alloy, and Sn—Bi based alloy.

In this way, since conductive filler 13a is solder alloy particles of low melting point, it is possible to prevent deterioration of photosensitive resin 13b due to heating in connecting operation.

Also, as photosensitive resin 13b, it is allowable to use photosensitive resin including one kind of photosensitive polyimide resin, photosensitive acrylic resin, and ene/thiol resin besides the photosensitive epoxy resin. In this way, by using a stereolithography method, fine protrusion electrode 13 can be efficiently formed in any shape. It is not shown, but photosensitive resin 13b is allowable to contain air capsule in it. In this case, as the air capsule is heated, it forms a void when the air is coming out of photosensitive resin 13b, and it is possible to obtain protrusion electrode 13 which is structurally more porous and flexible. Consequently, it is possible to absorb stresses in mounting operation and to reduce damage to electronic component 10 or the like.

Further, it is not shown, but the resin of photosensitive resin 13b is allowable to contain Au (gold), Cu (copper), Pt (platinum) or Ag (silver) particles of less than 10.0 μm or metal particles of less than 1.0 μm in average particle diameter. In this case, because the contact area is expanded due to metal with low specific resistance or fine metal particles, the contact resistance or specific resistance with respect to conductive filler at high resin component crosslink density portion 131a in particular can be further lowered.

In this preferred embodiment, conductive fillers at high resin component crosslink density portion are in contact with each other establishing conductive connection in the description, but the configuration is not limited by this description. For example, at high resin component crosslink density portion, the conductive fillers are allowable to be at least partially fusion-adhering to each other. In this way, the connection resistance can be further lowered.

In the present preferred embodiment, an example of disposing protrusion electrode 13 on electrode terminal 10a of electronic component 10 is mentioned in the description, but the configuration is not limited by this description. For example, protrusion electrode 13 is allowable to be disposed on connector terminal 12a of mounting substrate 12, and it is possible to obtain similar effects.

Also, in the present preferred embodiment, an example of protrusion electrode 13 formed of conductive filler 13a and photosensitive resin 13b is mentioned in the description, but the configuration is not limited by this description. For example, it is allowable to dispose conductive film such as plated gold or metallic nano-paste on the surface of protrusion electrode 13 by using a plating method. In this way, it is possible to further decrease the electrical resistance of protrusion electrode 13.

The manufacturing method for electronic component mounting structure in the first preferred embodiment of the present invention will be described in the following by using FIG. 2A to FIG. 2E.

FIG. 2A to FIG. 2E are conceptual cross-sectional views showing the manufacturing method of electronic component mounting structure in the first preferred embodiment of the present invention. Same component elements as in FIG. 1 are given same reference marks in the description.

The manufacturing method for electronic component mounting structure of the present invention comprises at least a protrusion electrode forming step for forming a protrusion electrode on an electrode terminal of the electronic component or a connector terminal of the mounting substrate, and a connecting step for connecting the electrode terminal to the connector terminal via the protrusion electrode.

An example of forming a protrusion electrode on an electrode terminal of the electronic component will be described in the following. First, the protrusion electrode forming step is described in detail.

Figure 2A:
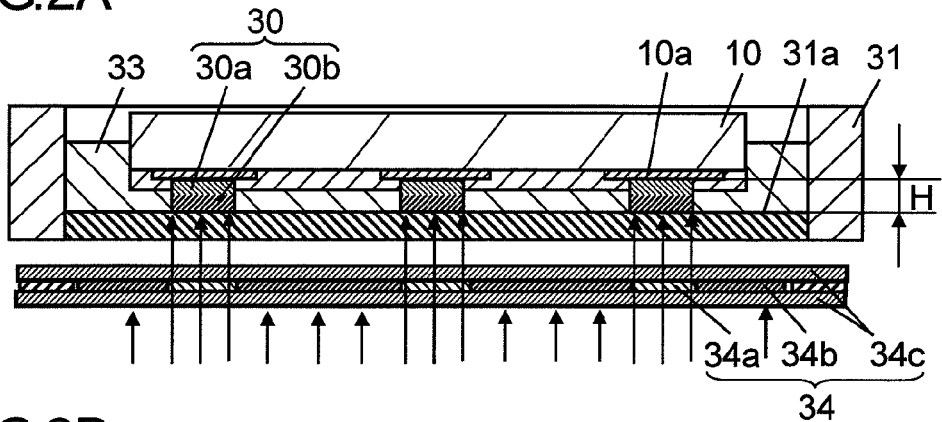
FIG. 2A is a conceptual cross-sectional view showing a manufacturing method for electronic component mounting structure in the first preferred embodiment of the present invention.

As shown in FIG. 2A, photosensitive resin liquid 33 formed from photosensitive epoxy resin for example, including conductive fillers (not shown) such as 90% by weight Sn—3.0Ag—0.5Cu based solder alloy particles (melting point 220° C.), is filled into container 31. And, electrode terminal 10a of electronic component 10 disposed at a stage (not shown) therein is immersed into photosensitive resin liquid 33 in a position facing to bottom surface 31a of container 31 at predetermined interval H. In this case, bottom surface 31a of container 31 is formed from an inorganic material such as quartz or organic material such as polyethylene terephthalate or acryl which allows transmission of ultraviolet light or visible light. In order to improve the releasing property, it is allowable to coat the surface with silicone oil, silicone-based, or fluorine-based releasing agent.

In the above description, the content of conductive filler formed of solder alloy particles is about 90%, but the configuration is not limited by this description. For example, it is allowable to be in a range from 50% to 95% by weight, but the bump resistance increases when it is less than 50% by weight, and the laminating thickness obtained each time lessens when it is greater than 95% by weight, causing the number of laminating layers to increase. Also, photosensitive resin liquid 33 is mixed with reactive diluent, photo-initiator, oligomer, monomer, dispersing agent, and solvent. Further, photosensitive resin liquid 33 is preferable to be mixed with air capsule, and it makes the photosensitive resin easier to become porous in curing of the resin. Also, it becomes easier to make the resin porous by increasing the reactive diluent or solvent to increase non-bridging components. Also, it is allowable to mix the liquid with rubber-like organic filler such as carbon nano-tube or silicon nano-tube, and thereby, the elasticity after curing of the resin can be enhanced.

In the above condition, photosensitive resin liquid 33 in a predetermined area corresponding to electrode terminal 10a of electronic component 10 is exposed by using as photomask 34 a liquid crystal panel formed with translucent liquid crystal layer 34b having liquid crystal cells two-dimensionally arranged for example held between transparent substrates 34c. In the figure, at least two polarizing plates, condenser lens, and electrodes of the liquid crystal panel are not shown.

And, in making an exposure, with driving signal voltage applied to a predetermined liquid crystal cell of the liquid crystal panel, light of specified wavelength such as ultraviolet light or visible light which may cure the photosensitive resin liquid through opening 34a formed in specified shape in a predetermined position is applied constantly or continuously increasing and decreasing the level of energy. In this case, the light is applied while moving the electronic component or mounting substrate in the photosensitive resin liquid. For example, in the case of making an exposure with constant light energy, it is preferable to execute the exposure while gradually increasing the moving speed, and in the case of movement at a constant speed, it is preferable to make the exposure while gradually decreasing the light energy. For example, in application of 3 mW/mm$^2$ illumination for 30 sec. it is lifted by 1 μm/s, resulting in forming a protrusion electrode of 50 μm×50 μm, 50 μm in height.

According to the above exposure method, it is possible to form a protrusion electrode which continuously varies in polymerization degree of photosensitive resin liquid 33 in the height direction of protrusion electrode. For example, in FIG. 2A, as photosensitive resin liquid 33 in the vicinity of the surface of electrode terminal 10a of electronic component 10 is moved from photosensitive resin portion of high polymerization degree 30a of about 70%, away from the surface of electrode terminal 10a in the height direction (downward in the figure) thereof, the polymerization degree is continuously lowered, and in the vicinity of bottom surface 31a of container 31, photosensitive resin liquid 33 is formed as photosensitive resin portion of low polymerization degree 30b of about 30%. In this way, it is possible to form Pre-protrusion electrode 30 which continuously varies in polymerization degree of photosensitive resin with respect to the direction of height.

In the above step, a liquid crystal panel is used as a photomask, and even in the case of electronic components different in electrode terminal shape, position, and quantity, the opening can be freely changed without replacing the photo-mask. Also, the opening of the mask uses a gray scale instead of white or black in the vicinity of the periphery by making use of the display gray scale (e.g. 256 gray scales) of liquid crystal, and thereby, surplus growth due to scattering light can be reduced, and it is possible to sharpen the edge of the protrusion electrode.

Also, since photosensitive resin liquid 33 is photo-cured in a state of being held between electronic component 10 and bottom surface 31a of container 31, it will never be exposed to the air, and therefore, it is possible to use photosensitive resin of radical curing type that is liable to be subjected to the influence of oxygen inhibition.

Figure 2B:
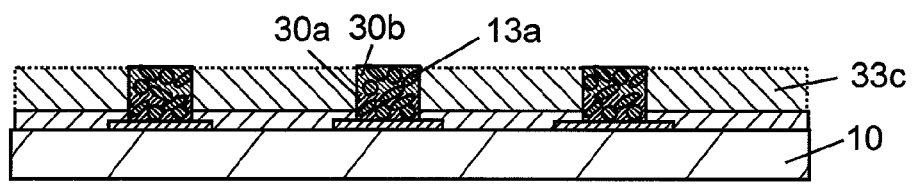
FIG. 2B is a conceptual cross-sectional view showing the manufacturing method for electronic component mounting structure in the first preferred embodiment of the present invention.

Next, as shown in FIG. 2B, unexposed portion 33c of photosensitive resin liquid 33 remaining on electronic component 10 is removed.

Figure 2C:
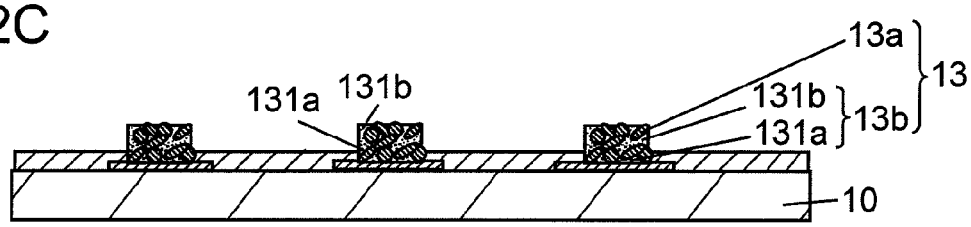
FIG. 2C is a conceptual cross-sectional view showing the manufacturing method for electronic component mounting structure in the first preferred embodiment of the present invention.

Subsequently, as shown in FIG. 2C, Pre-protrusion electrode 30 formed from photosensitive resin portion including conductive filler 13a and varying in polymerization degree in the direction of height is heated at about 200° C., and volatile components such as reactive diluent and solvent are volatilized. In this case, due to the difference in polymerization degree, photosensitive resin portion of high polymerization degree 30a and photosensitive resin portion of low polymerization degree 30b are different from each other with respect to the volatilizing amount of resin component and volatile component. Consequently, the resin component crosslink density of the photosensitive resin portion of Pre-protrusion electrode 30 is formed from low resin component crosslink density portion 131b to high resin component crosslink density portion 131a continuously in the direction of height thereof. And, in the vicinity of at least low resin component crosslink density portion 131b, voids are formed between conductive fillers due to volatilization of photosensitive resin component, thereby creating a porous state.

According to the above step, for example, cylindrical protrusion electrode 13 is formed on electrode terminal 10a of electronic component 10, which includes conductive filler 13a and continuously varies in resin component crosslink density of photosensitive resin, having high resin component crosslink density portion 131a and low resin component crosslink density portion 131b. In the case of this preferred embodiment, it becomes porous in the vicinity of electrode terminal 10a side where the resin component crosslink density is high, and at the tip end of protrusion electrode 13 where the resin component crosslink density is low. In this case, porous regions are not clearly generated but porous states change continuously.

The connecting step will be described in detail in the following.

Figure 2D:
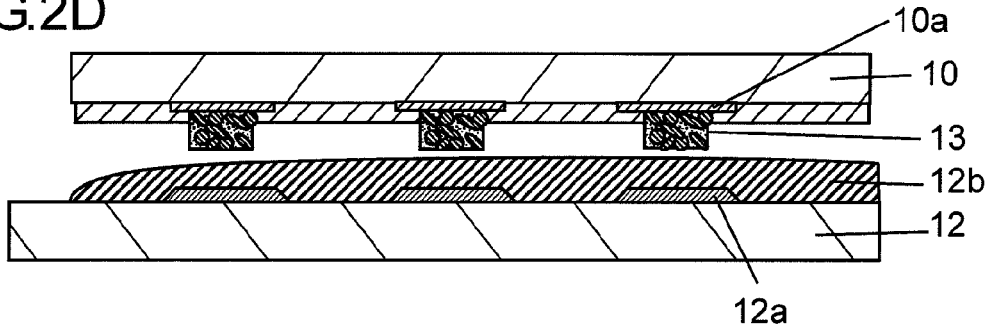
FIG. 2D is a conceptual cross-sectional view showing the manufacturing method for electronic component mounting structure in the first preferred embodiment of the present invention.

First, as shown in FIG. 2D, electronic component 10 formed with protrusion electrode 13 is faced to connector terminal 12a of mounting substrate 12, and the position of electrode terminal 10a is adjusted to the position of connector terminal 12a via protrusion electrode 13. In this case, before the positioning step, it is desirable to form insulating resin layer 12b by coating insulating resin on the surface of mounting substrate 12 formed with connector terminal 12a. Also, it is allowable to form an anisotropic conductive resin layer or anisotropic conductive resin sheet.

Figure 2E:
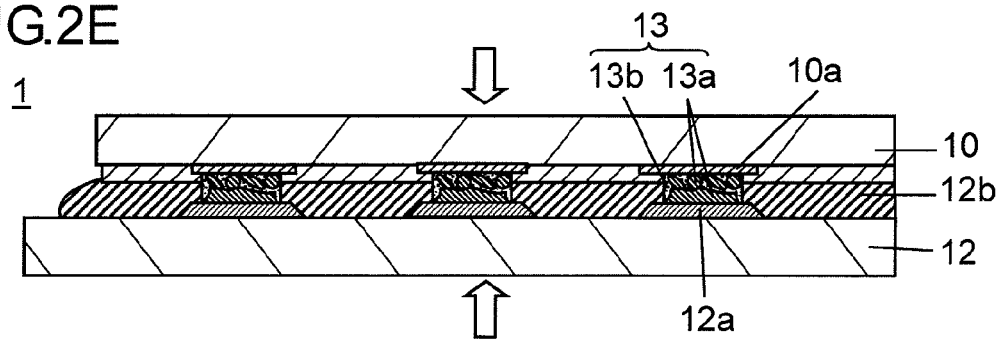
FIG. 2E is a conceptual cross-sectional view showing the manufacturing method for electronic component mounting structure in the first preferred embodiment of the present invention.

Next, as shown in FIG. 2E, at least one of electronic component 10 formed with protrusion electrode 13 and mounting substrate 12 is press-fitted thereon, and heated for 60 sec. at 240° C. being higher than the melting temperature (e.g. about 220° C.) of solder that is conductive filler 13a. It is allowable to perform the operation in nitrogen or hydrogen atmosphere in order to remove film oxided on solder surface. In the press-fitting operation, due to deformation of porous and low resin component crosslink density portion 131b of protrusion electrode 13, press-fitting stresses applied in both substrate directions are absorbed or decreased, realizing press-fitting operation with low pressing forces. Also, due to the heating, at porous and low resin component crosslink density portion 131b of protrusion electrode 13, it is subjected to fusion-adhering and metallization because of high density of conductive filler 13a. And, metalized conductive filler 13a is soldered to the interface of connector terminal 12a of mounting substrate 12.

Also, at high resin component crosslink density portion 131a of photosensitive resin 13b of protrusion electrode 13, conductive fillers 13a come in contact with or partially fusion-adhere to each other. And, due to the high resin component density, the connection is made with great adhesion to electrode terminal 10a of electronic component 10.

As described above, electrode terminal 10a of electronic component 10 can be connected to connector terminal 12a of mounting substrate 12 with low pressing forces via protrusion electrode 13 which continuously varies in resin component crosslink density of photosensitive resin in the direction of height.

And, after the connecting step, insulating resin layer 12b between electronic component 10 and mounting substrate 12 is cured, for example, at 120° C. for 30 minutes, thereby securing electronic component 10 and mounting substrate 12. For example, when the electronic component includes 100 pieces of protrusion electrodes, the connection resistance value obtained per protrusion electrode is less than 20 mΩ with pressing force 500 g applied. Also, as a result of thermal impact tests of the mounting structure by repeating—40° C. for 30 min./85° C. for 30 min., the connection resistance value obtained after 1000 cycles is less than 20 mΩ.

In this way, since insulating resin is formed between the electronic component and the mounting substrate, the area around the connection of the protrusion electrode is protected and increased in adhesion, thereby greatly improving the connection reliability such as impact resistance and drop-shock resistance.

According to the present preferred embodiment, it is possible to execute the mounting with low pressing forces at low resin component crosslink density portion of photosensitive resin of the protrusion electrode, and also, stresses generated in pressing operation are absorbed by porous structure, enhancing the connection reliability and enabling the prevention of breakdown of the electronic component. Also, in the connecting operation, the conductive fillers at the low resin component crosslink density portion of photosensitive resin are subjected to fusion-adhering to each other and metalized, while the conductive fillers at the high resin component crosslink density portion are in contact with each other, making it possible to reduce the connection resistance. Further, due to the high resin component crosslink density portion, the adhesion to the mounting substrate or electronic component becomes greater, and it is possible to realize an electronic component mounting structure having excellent adhesion. Also, using a stereolithography method, fine protrusion electrodes can be formed from photosensitive resin, and it is possible to realize an electronic component mounting structure capable of meeting the requirement for narrower pitches with excellent productivity at low costs.

In this preferred embodiment, a protrusion electrode is formed in cylindrical shape as described in the example, but the configuration is not limited by this description. For example, it is allowable to be columnar, square columnar, conical, pyramid-shaped, conic rectangular, pyramid-rectangular or cylindrical.

In the present preferred embodiment, before the positioning step, insulating resin is coated on the surface of electronic component having electrode terminal or the surface of mounting substrate having connector terminal, and after the connecting step, the insulating resin is cured to secure the electronic component on the mounting substrate, as described in the example, but the configuration is not limited by this description. For example, after the connecting step, insulating resin is filled and cured between electronic component and mounting substrate to secure the electronic component on the mounting substrate, and it brings about similar effects.

Also, in the present preferred embodiment, insulating resin is formed between electronic component and mounting substrate, but the configuration is not limited by this description. For example, before the positioning step, an anisotropic conductive resin sheet is disposed on the surface of electronic component having electrode terminal or the surface of mounting substrate having connector terminal, and in the connecting step, the anisotropic conductive resin sheet is cured under pressure in order to secure the electronic component on the mounting substrate. In this way, similar effects can be obtained the same as in insulating resin layer, and conductive particles in anisotropic conductive resin sheet are able to absorb warp of the substrate.

Further, in the preferred embodiment, a protrusion electrode is formed on the electrode terminal of electronic component as described, but it is also preferable to be formed on the connector terminal of mounting substrate, and similar effects can be obtained.

Second Preferred Embodiment

Figure 3:
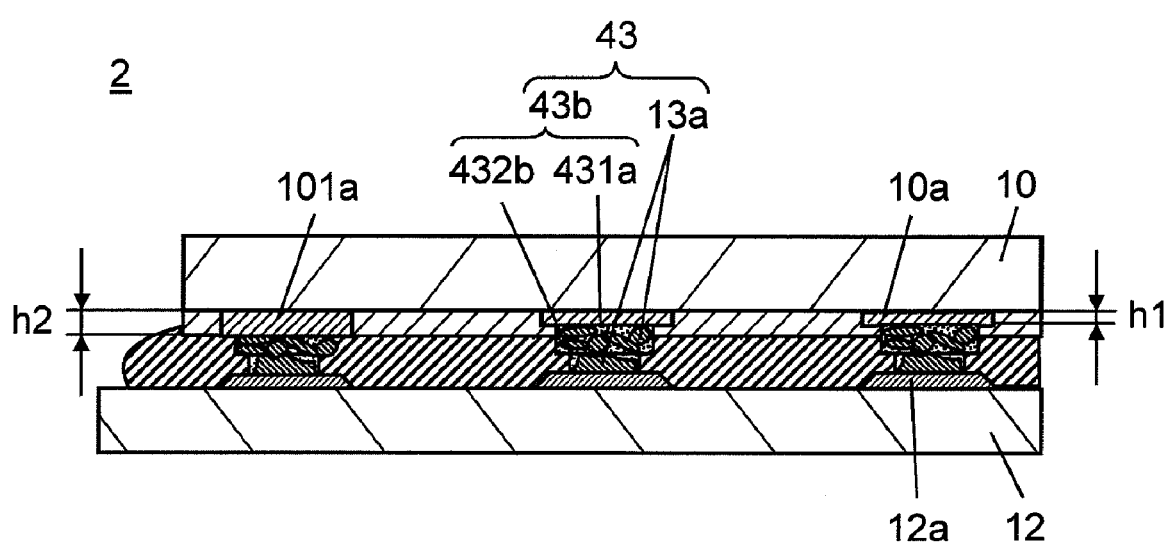
FIG. 3 is a conceptual cross-sectional view showing a configuration of an electronic component mounting structure in a second preferred embodiment of the present invention.

FIG. 3 is a conceptual cross-sectional view showing the configuration of electronic component mounting structure in the second preferred embodiment of the present invention. Same component elements as in FIG. 1 are given same reference marks in the description.

That is, in FIG. 3, the protrusion electrode is different from FIG. 1 in such point that it is formed of a plurality of layers varying in resin component crosslink density of photosensitive resin in the direction of height. Also, out of the plurality of layers of the protrusion electrode, at least the thickness (height) of the first layer being in contact with the electrode terminal is different from the position of the electrode terminal as described in the following example, but it is allowable to be no difference between them.

As shown in FIG. 3, electronic component mounting structure 2 in the second preferred embodiment of the present invention is configured in that electronic component 10 having a plurality of electrode terminals 10a, 101a is connected to mounting substrate 12 provided with connector terminal 12a in a position facing to electrode terminal 10a, 101a via protrusion electrode 43. And, protrusion electrode 43 is formed of a plurality of layers varying in resin component crosslink density including conductive filler 13a and photosensitive resin 43b at least in the height (connecting) direction of protrusion electrode 43. For example, as shown in FIG. 3, protrusion electrode 43 is formed of two layers, first layer 431a being high in resin component crosslink density of photosensitive resin 43b and second layer 432b being low in resin component crosslink density thereof. A protrusion electrode having two layers is described in the following, but the configuration is not limited by this description, and it is allowable to have a plurality of layers, three or more layers.

Also, when the height (h2) of electrode terminal 101a is different from the height (h1) of other electrode terminal 10a depending upon the position of electrode terminal 10a of electronic component 10, at least the thickness of first layer 431a being in contact with electrode terminal 101a of protrusion electrode 43 is decreased, for example, so that first layer 431a and electrode terminal 101a become same in total height. And, second layer 432b is formed on first layer 431a.

That is, in electrode terminals 10a, 101a having different heights h1, h2, it is possible to make them same in height by adjusting the height of protrusion electrode 43 formed of a plurality of layers. And, using the same production method as in the first preferred embodiment, porous second layer 432b of protrusion electrode 43 is formed at least.

In this way, even in case of electrode terminals being different in height (thickness), protrusion electrodes being uniform in height can be easily formed. Also, protrusion electrode 43 having second layer 432b which is at least porous and low in resin component crosslink density absorbs stresses generated in press-fitting and heating operation, enabling the connection with low pressing forces.

In the present preferred embodiment, a first layer is disposed as a layer being high in resin component crosslink density, and a second layer is disposed as a layer being low in resin component crosslink density, as described in the example, but the configuration is not limited by this description. For example, the configuration is allowable to have a first layer being low in resin component crosslink density and a second layer being high in resin component crosslink density, of which the resin component crosslink density is optional with respect to the layers. In this way, similar effects can be obtained. Also, when the configuration has three layers, it is possible to obtain similar effects by making the first layer and third layer low in crosslink density and the second layer high in crosslink density.

Figure 4A:
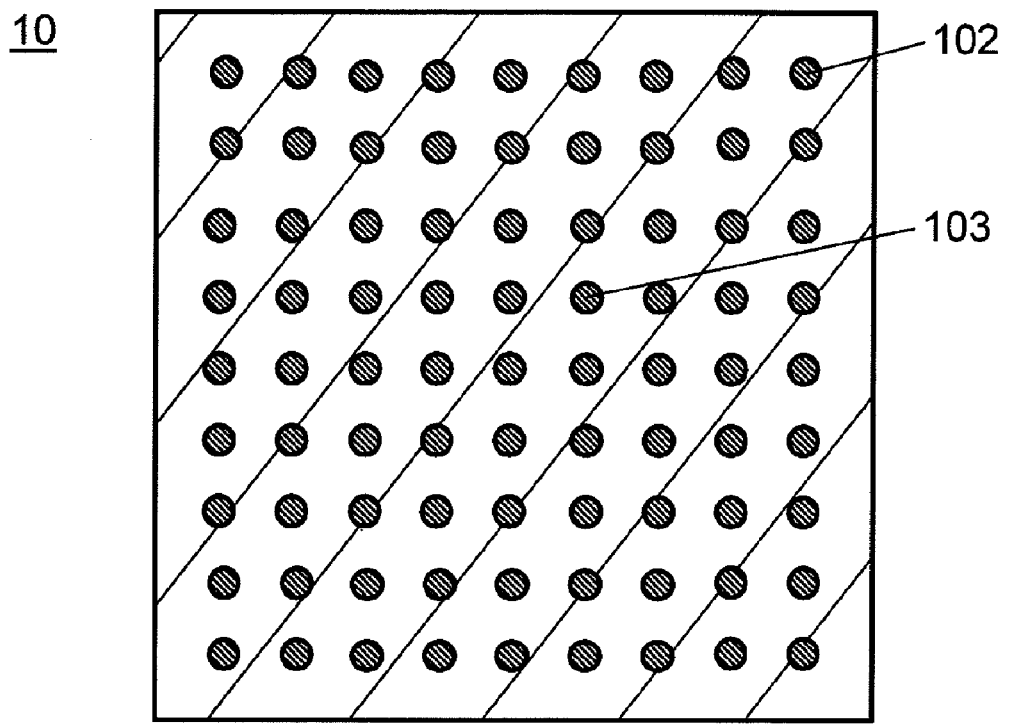
FIG. 4A is an illustration showing a arrangement of electrode terminals of the electronic component of an electronic component mounting structure in the second preferred embodiment of the present invention.
Figure 4B:
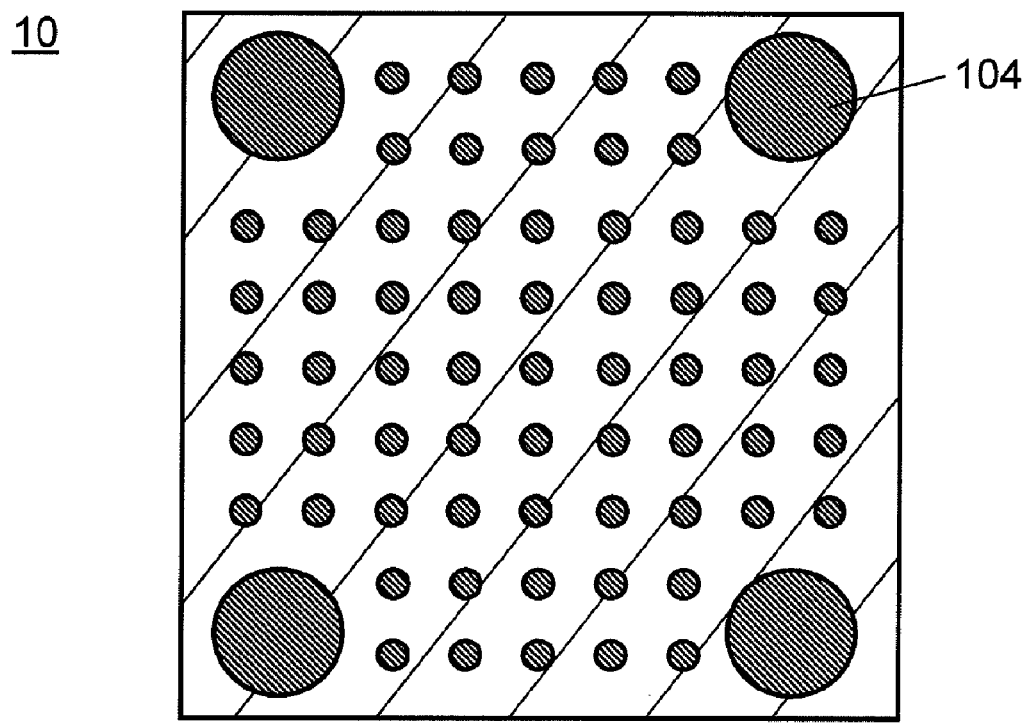
FIG. 4B is an illustration showing the arrangement of electrode terminals of the electronic component of the electronic component mounting structure in the second preferred embodiment of the present invention.

Also, as shown in FIG. 4A, in electronic component 10 such as LSI chip having an area bump configuration, it is allowable to change the thickness of first layer of the protrusion electrode, for example, peripheral electrode terminal 102 or internal electrode terminal 103, and to increase the thickness of the layer being porous and low in resin component crosslink density of peripheral electrode terminal 102. Further, as shown in FIG. 4B, for example, it is preferable to provide dummy bump 104 being different in area and low in resin component crosslink density in the vicinity of four corners of electronic component 10.

As a result, the difference in stress around the central portion and around the peripheral portion that is liable to be generated in press-fitting an electronic component having a large area can be uniformly absorbed at a high degree of balance by protrusion electrodes increased in thickness of the first layer and protrusion electrodes different in area, and it is possible to prevent breakdown of the electronic component and to further improve the connection reliability.

Also, in the present preferred embodiment, one piece of electronic component is used, as described in the example, but the configuration is not limited by this description. For example, an electronic component having electrode terminals different in height from each other or an electronic components different in thickness are formed with layered protrusion electrodes adjusted in height so as to become equal in total thickness, and these are disposed in a plurality of layers or side by side and mounted on one sheet of mounting substrate. In this way, it is possible to mount electronic components with electrode terminals different in height and thickness all together with less stresses.

Further, in the present preferred embodiment, a substrate with electrode terminals same in height is used, as described in the example, but in the case of a substrate with level difference (step) due to electrode terminals different in height, it can be mounted with less stresses by forming the protrusion electrode according to the height of the substrate.

The manufacturing method for electronic component mounting structure 2 in the second preferred embodiment of the present invention will be described in detail in the following.

Figure 5A:
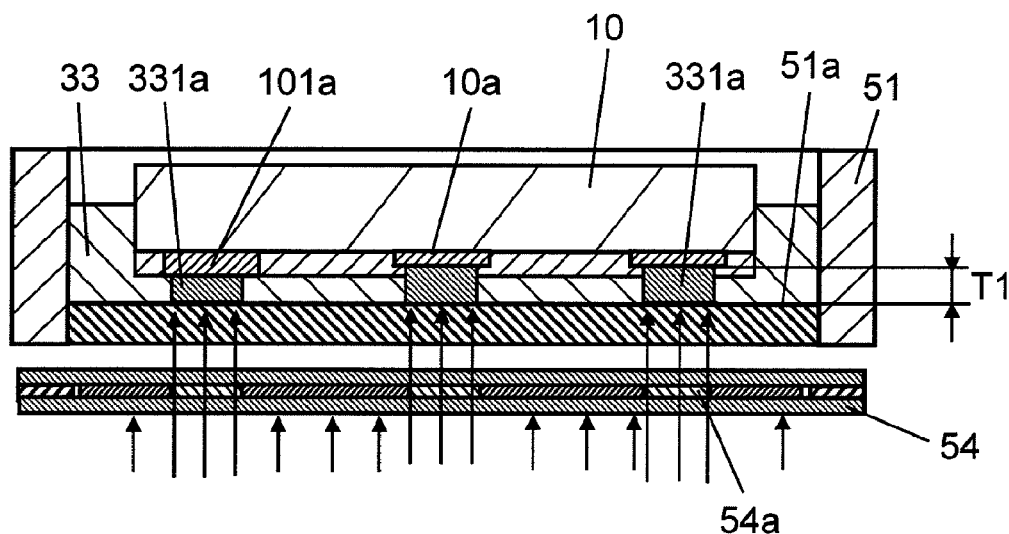
FIG. 5A is a conceptual cross-sectional view showing a manufacturing method for electronic component mounting structure in the second preferred embodiment of the present invention.
Figure 5B:
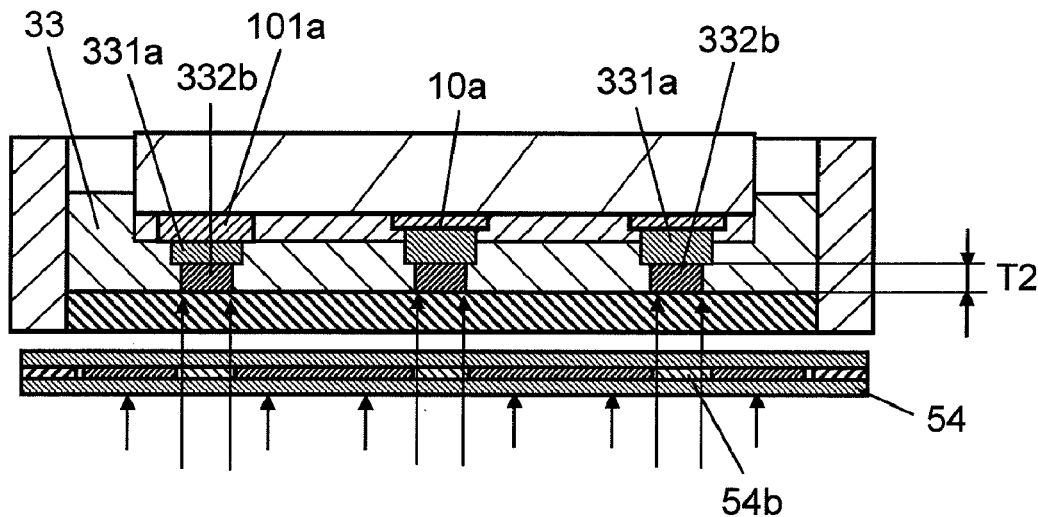
FIG. 5B is a conceptual cross-sectional view showing the manufacturing method for electronic component mounting structure in the second preferred embodiment of the present invention.
Figure 5C:
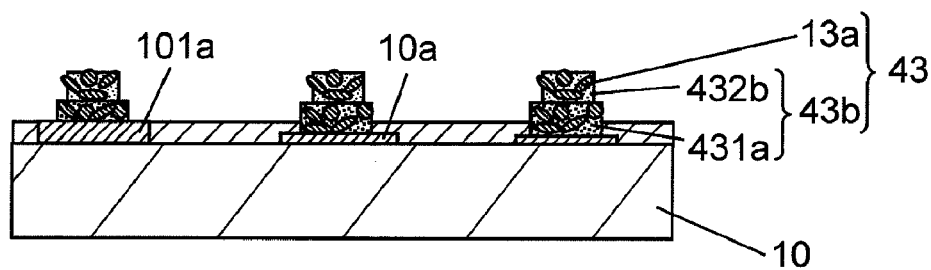
FIG. 5C is a conceptual cross-sectional view showing the manufacturing method for electronic component mounting structure in the second preferred embodiment of the present invention.

FIG. 5A to FIG. 5C are conceptual cross-sectional views showing the manufacturing method for electronic component mounting structure 2 in the second preferred embodiment of the present invention. Same component elements as in FIG. 2A to FIG. 2E are given same reference marks in the description.

FIG. 5A to FIG. 5C are different from electronic component 10 of FIG. 1 in such point that the protrusion electrode forming step includes a step of forming the electrode in a plurality of layers varying in resin component crosslink density of photosensitive resin in the direction of height and also that the height of electrode terminal of the electronic component partially varies with the positions. First, the protrusion electrode forming step is first described in detail.

As shown in FIG. 5A, photosensitive resin liquid 33 made from photosensitive epoxy resin liquid for example, including conductive filler (not shown) such as 80% by weight of Sn—Ag—Cu based solder alloy particles, is filled into container 51. And, electrode terminal 10a of electronic component 10 disposed at a stage (not shown) is immersed in photosensitive resin liquid 33 in a position faced at predetermined interval T1 to bottom surface 51a of container 51. In this case, bottom surface 51a of container 51 is formed from inorganic material such as quartz or organic material such as polyester terephthalate which allows for example the transmission of ultraviolet light and visible light.

In the above condition, strong light (having energy equivalent to 70% to 100% curing of photosensitive resin liquid) is applied from bottom surface 51a of container 51 via first opening 54a formed in the liquid crystal panel of photo-mask 54 for making an exposure in order to form first layer of high polymerization degree 331a of photosensitive resin all together on a plurality of electrode terminals 10a, 101a. In this case, first layers of high polymerization degree 331a of protrusion electrode are adjusted in thickness so as to become same in height on electrode terminals 10a, 101a different in height (thickness).

Subsequently, as shown in FIG. 5B, in photosensitive resin liquid 33, electronic component 10 formed with first layer 31a being high in polymerization degree is lifted by predetermined distance T from bottom surface 51a via the stage. And, weak light (having energy equivalent to 30% to 70% curing of photosensitive resin liquid) is applied via second opening 54b formed in the liquid crystal panel of photo-mask 54 for the purpose of exposing photosensitive resin liquid 33 on first layer of high polymerization degree 331a.

Thus, second layer of low polymerization degree 332b of photosensitive resin are formed all together on first layer of high polymerization degree 331a of photosensitive resin.

Subsequently, it is not shown but unexposed portion of photosensitive resin liquid 33 including conductive filler is removed through development.

And, as shown in FIG. 5C, a plurality of layers of photosensitive resin including conductive filler 13a and varying in polymerization degree in the direction of height are heated at 100° C. to volatilize the volatile components such as reactive diluent and solvent contained therein. In this case, first layer of high polymerization degree 431a of photosensitive resin and second layer of low polymerization degree 332b are, due to difference in polymerization degree, different from each other in the volatilizing amount of the resin component and volatile component. As a result, protrusion electrode 43 formed of first layer 431a being high in resin component crosslink density of photosensitive resin and second layer 432b being low in resin component crosslink density is formed on electrode terminal 10a. And, at least second layer of low polymerization degree 332b of photosensitive resin changes to second layer 432b being low in resin component crosslink density in a state of being porous with voids formed between conductive fillers due to volatilization.

According to the above step, protrusion electrode 43 having first layer 431a being high in resin component crosslink density of photosensitive resin and second layer 432b being low in resin component crosslink density is formed, including conductive filler 13a, on electrode terminal 10a of electronic component 10.

After that, according to the connecting step same as in the first preferred embodiment, electronic component mounting structure 2 is manufactured by connecting electrode terminals 10a, 101a different in height to connector terminal 12a via protrusion electrode 43.

In the above description, the protrusion electrode is formed in two layers, but the configuration is not limited by this description. It is allowable to be configured in three or more layers.

Also, in the above description, the level of light energy is changed in forming each layer, as described in the example, but the configuration is not limited by this description. For example, it is also preferable to change the time of applying constant light energy, focusing position, and peak wavelength for making an exposure.

In the present preferred embodiment, the protrusion electrode can be formed by a plurality of layers varying in resin component crosslink density of photosensitive resin in the direction of height. And, by making it low in resin component crosslink density and structurally porous, it is possible to execute the mounting with low pressing forces and to decrease stresses generated in pressing operation. As a result, the connection reliability can be improved and the electronic component can be efficiently prevented from breakdown.

Also, even in case the electrode terminals are different in height (thickness), it is possible to easily form protrusion electrodes which are uniform in height.

The above description is given with respect to the height of electrode terminal at the electronic component side, but when the electrodes at the substrate side are different in height (having level difference (step) for example), it is also possible to cope with the problem by changing the height of protrusion electrode.

Another example of manufacturing method for electronic component mounting structure in the second preferred embodiment of the present invention will be described in the following by using FIG. 6A and FIG. 6B.

Figure 6A:
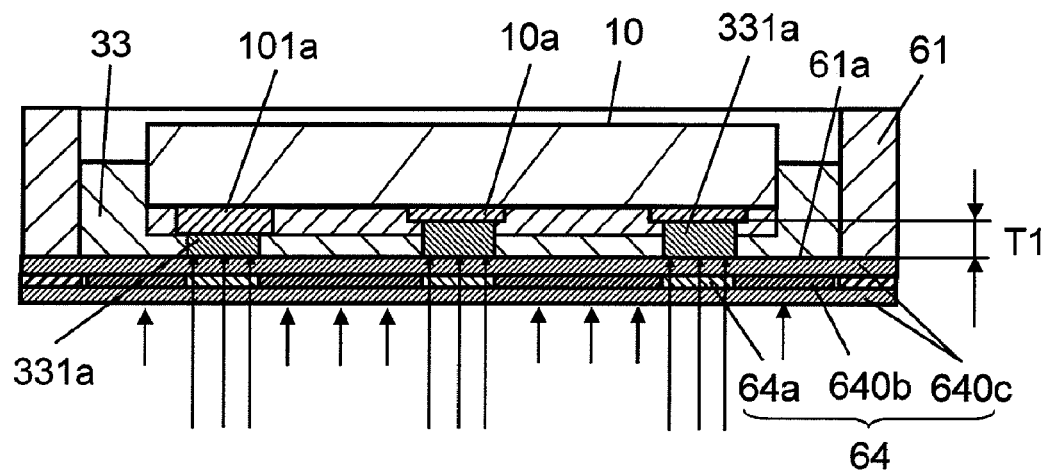
FIG. 6A is a conceptual cross-sectional view showing another example of manufacturing method for electronic component mounting structure in the second preferred embodiment of the present invention.
Figure 6B:
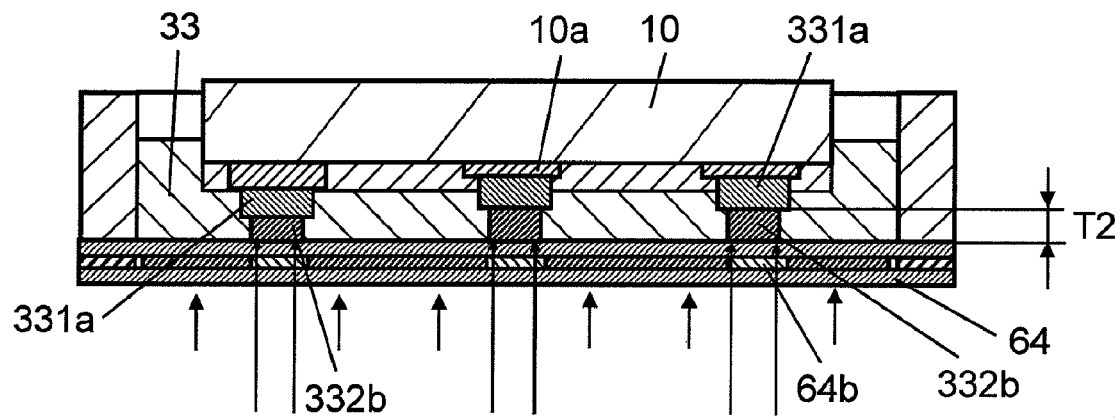
FIG. 6B is a conceptual cross-sectional view showing another example of manufacturing method for electronic component mounting structure in the second preferred embodiment of the present invention.

FIG. 6A and FIG. 6B are conceptual cross-sectional views showing another example of manufacturing method for electronic component mounting structure in the second preferred embodiment of the present invention. Same component elements as in FIG. 5A to FIG. 5C are given same reference marks in the description.

That is, FIG. 6A and FIG. 6B are different from FIG. 5A to FIG. 5C in such point that the bottom of container that contains photosensitive resin for forming protrusion electrodes is used as a photo-mask formed by a liquid crystal panel, and same in other configurations.

As shown in FIG. 6A, a liquid crystal panel is disposed at bottom surface 61a of container 61 for feeding photosensitive resin liquid 33, and the liquid crystal panel is used as photo-mask 64 to form protrusion electrodes on electrode terminals of the electronic component. And, photo-mask 64 disposed at bottom surface 61a is a transparent liquid crystal panel with liquid crystal cells two-dimensionally arranged, holding at least liquid crystal layer 640b between two sheets of transparent substrates 640c. The shape and position of first opening 64a for transmission of light are electrically controlled by the driving signal voltage applied to the liquid crystal panel. Two-dimensional picture information is displayed on the liquid crystal panel via a personal computer.

And, same as in the protrusion electrode forming step described in FIG. 5A, photosensitive resin liquid 33 including conductive filler is fed into container 61. And, electrode terminal 10a of electronic component 10 disposed at a stage (not shown) is immersed in photosensitive resin liquid 33, facing it to bottom surface 61a of container 61 at predetermined interval T1.

In the above condition, strong light (having energy equivalent to 70% to 100% curing of photosensitive resin liquid) is applied through first opening 64a formed in the liquid crystal panel of photo-mask 64, bottom surface 61a of container 61, for the purpose of exposure. In this way, first layer of high polymerization degree 331a of photosensitive resin is formed all together on a plurality of electrode terminals 10a, 101a. In this case, first layers of high polymerization degree 331a of protrusion electrodes are adjusted in thickness so as to become same in height on electrode terminals 10a, 101a different in height (thickness).

Subsequently, as shown in FIG. 6B, in photosensitive resin liquid 33, electronic component 10 formed with first layer of high polymerization degree 331a is lifted by predetermined distance T2 from photo-mask 64, bottom surface 61a, via a stage. And, weak light (having energy equivalent to 30% to 70% curing of photosensitive resin liquid) is applied from second opening 64b of photo-mask 64 for executing the exposure of photosensitive resin liquid 33 on first layer of high polymerization degree 331a.

Thus, second layer of low polymerization degree 332b of photosensitive resin are formed all together on first layer of high polymerization degree 331a of photosensitive resin.

Subsequently, it is not shown but unexposed portion of photosensitive resin liquid 33 including conductive filler is removed through development.

And, it is not shown, but same as in the step of FIG. 5C, photosensitive resin not polymerized and volatile component (solvent, reactive diluent) in the protrusion electrode is heated and volatilized to form first layer 431a being high in resin component crosslink density and second layer 432b being low in resin component crosslink density. In this case, at least second layer 432b being low in resin component crosslink density makes it porous by heating.

According to the above step, protrusion electrode 43 having first layer 431a and second layer 432b different from each other in resin component crosslink density of photosensitive resin is formed, including conductive filler 13a, on electrode terminal 10a of electronic component 10.

After that, according to the connecting step same as in the first preferred embodiment, electronic component mounting structure 2 is manufactured by connecting electrode terminals 10a, 101a different in height to connector terminal 12a via protrusion electrode 43.

According to another example of the present preferred embodiment, since the photo-mask formed of a liquid crystal panel also serves as the bottom of container, it is not necessary to use expensive transparent member such as quartz. Also, the opening of the photo-mask can be directly positioned to the electrode terminal of electronic component, assuring excellent positioning accuracy, and scattering due to the transparent member can be reduced, making it easier to meet the requirement for fine and narrower pitches.

Third Preferred Embodiment

Figure 7A:
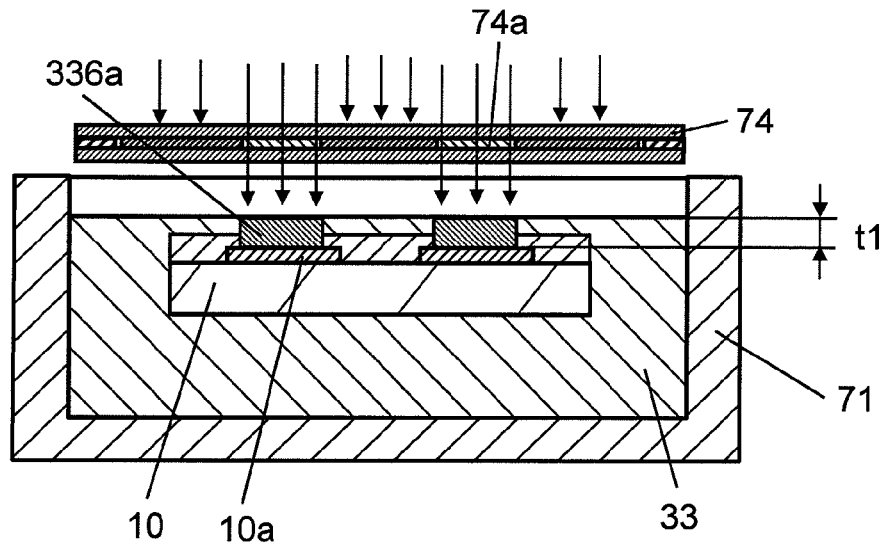
FIG. 7A is a conceptual cross-sectional view showing a manufacturing method for electronic component mounting structure in a third preferred embodiment of the present invention.
Figure 7B:
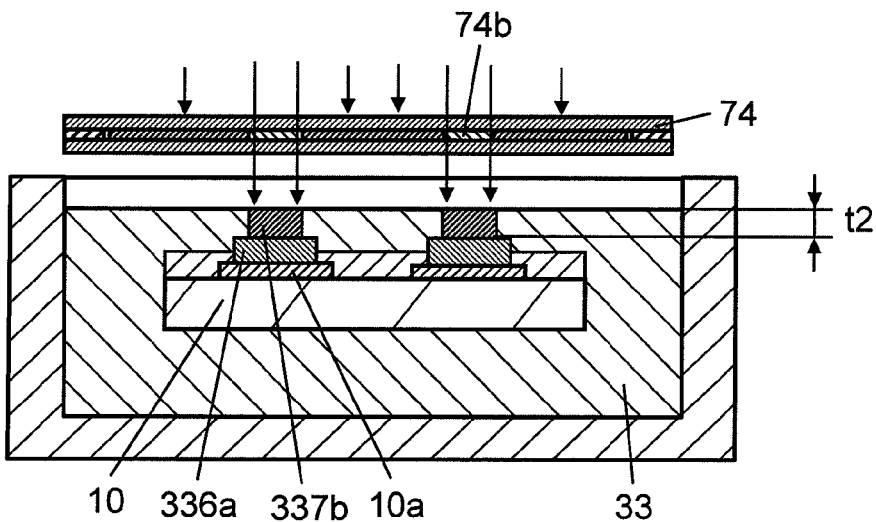
FIG. 7B is a conceptual cross-sectional view showing the manufacturing method for electronic component mounting structure in the third preferred embodiment of the present invention.
Figure 7C:
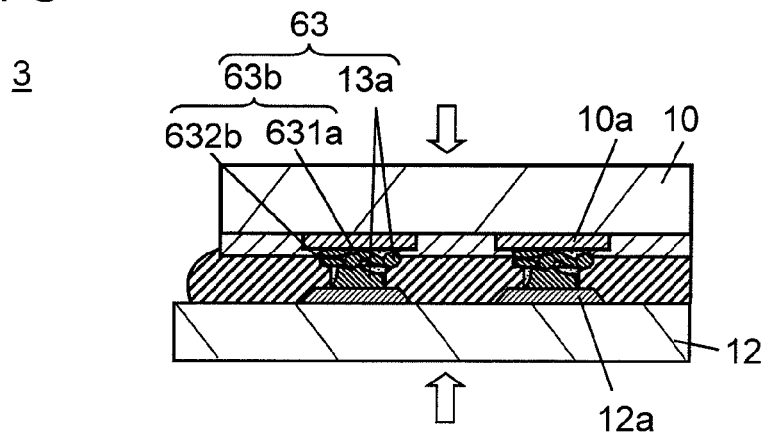
FIG. 7C is a conceptual cross-sectional view showing the manufacturing method for electronic component mounting structure in the third preferred embodiment of the present invention.

FIG. 7A to FIG. 7C are conceptual cross-sectional views showing the manufacturing method for electronic component mounting structure in the third preferred embodiment of the present invention. Same component elements as in the second preferred embodiment are given same reference marks in the description.

That is, the third preferred embodiment is different from the second preferred embodiment in such point that the protrusion electrode is formed while immersing the electronic component in the photosensitive resin liquid.

First, as shown in FIG. 7A, for example, photosensitive resin liquid 33 formed from photosensitive epoxy resin liquid, including conductive filler (not shown) such as 90% by weight of Sn—Ag—In solder alloy particles, is fed into container 71. And, electrode terminal 10a of electronic component 10 disposed at a stage (not shown) is immersed in photosensitive resin liquid 33 up to a position of predetermined interval t1 from the liquid surface of photosensitive resin liquid 33.

In the above condition, strong light (having energy equivalent to 70% to 100% curing of photosensitive resin liquid) is applied into container 71 from the liquid surface side of photosensitive resin liquid 33 via first opening 74a formed in the liquid crystal panel, photo-mask 64, for executing the exposure, and thereby, first layer of high polymerization degree 336a of photosensitive resin is formed all together on a plurality of electrode terminals 10a.

Subsequently, as shown in FIG. 7B, in photosensitive resin liquid 33, electronic component 10 formed with first layer of high polymerization degree 336a is settled in photosensitive resin liquid 33 via a stage by predetermined distance t2. And, weak light (having energy equivalent to 30% to 70% curing of photosensitive resin liquid) is applied from second opening 74b of photo-mask 74 for executing the exposure of photosensitive resin liquid 33 on first layer of high polymerization degree 336a.

In this way, second layer of low polymerization degree 337b is formed all together on first layer of high polymerization degree 336a.

Next, it is not shown, but unexposed portion of photosensitive resin liquid 33 including conductive filler is removed through development.

Subsequently, it is not shown, but same as in the step of FIG. 5C, a plurality of layers of photosensitive resin including conductive filler 13a and varying in polymerization degree in the direction of height are heated at about 100° C., and volatile components such as reactive diluent and solvent contained therein are volatilized. In this case, first layer of high polymerization degree 336a of photosensitive resin and second layer of low polymerization degree 337b are, due to difference in polymerization degree, different from each other in the volatilizing amounts of resin component and volatile component. As a result, protrusion electrode 63 formed of first layer 631a being high in resin component crosslink density of photosensitive resin 63b and second layer 632b being low in resin component crosslink density is formed on electrode terminal 10a. And, at least second layer of low polymerization degree 337b of photosensitive resin changes to second layer 632b in a state of being porous with voids formed between conductive fillers due to volatilization.

Next, as shown in FIG. 7C, according to the connecting step same as in the second preferred embodiment, electronic component mounting structure 3 is manufactured by connecting electrode terminal 10a to connector terminal 12a via protrusion electrode 63.

In the present preferred embodiment, same effects as in the second preferred embodiment can be obtained, and it is not necessary to use any transparent member for the container, and also, not necessary to form a photo-mask at the bottom. Accordingly, it is possible to manufacture protrusion electrodes and electronic component mounting structure at low costs by using inexpensive manufacturing equipment.

In the above second and third preferred embodiments, a protrusion electrode formed from two-layered photosensitive resin is described in the example, but the configuration is not limited by this description. For example, as the protrusion electrode forming step, it is preferable to form a plurality of layers different in polymerization-degree by repeating the lifting step and the exposing step. In this way, since a plurality of layers different in resin component crosslink density can be optionally formed, it is possible to form protrusion electrodes capable of freely adjusting stress absorption in accordance with the necessary pressing force. As a result, breakdown of the electronic component and generation characteristic change can be efficiently prevented.

Also, in the second and third preferred embodiments, the difference in shape (size) between the first opening and the second opening of the photo-mask is described in the example, but the configuration is not limited by this description. For example, even when the first opening and the second opening of the photo-mask are same in shape, that is contrary to the above preferred embodiments, it is preferable and free to use the configuration. Thus, it is possible to realize an electronic component mounting structure that assures excellent adhesion.

Fourth Preferred Embodiment

Figure 8A:
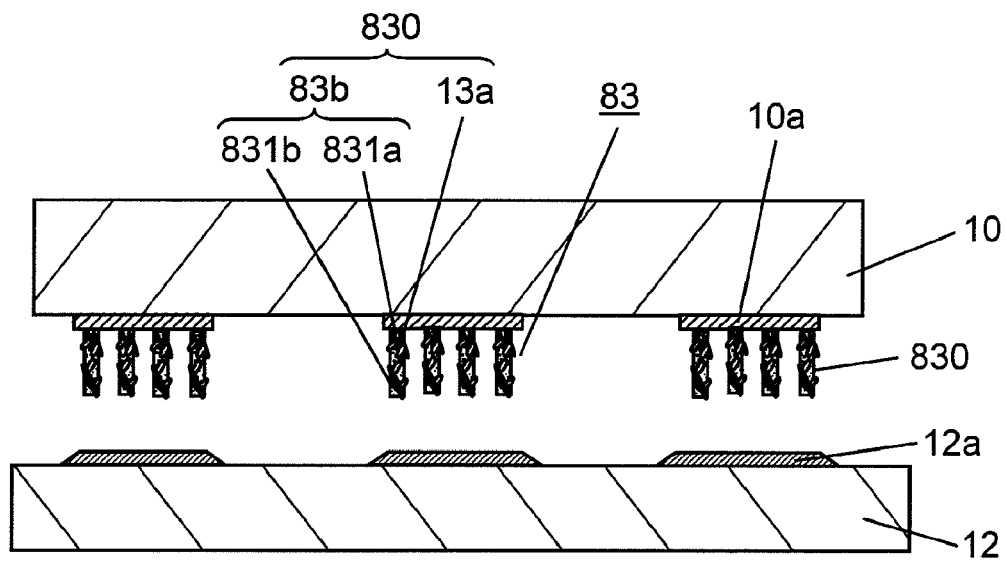
FIG. 8A is a conceptual cross-sectional view showing a configuration and manufacturing method for electronic component mounting structure in a fourth preferred embodiment of the present invention.
Figure 8B:
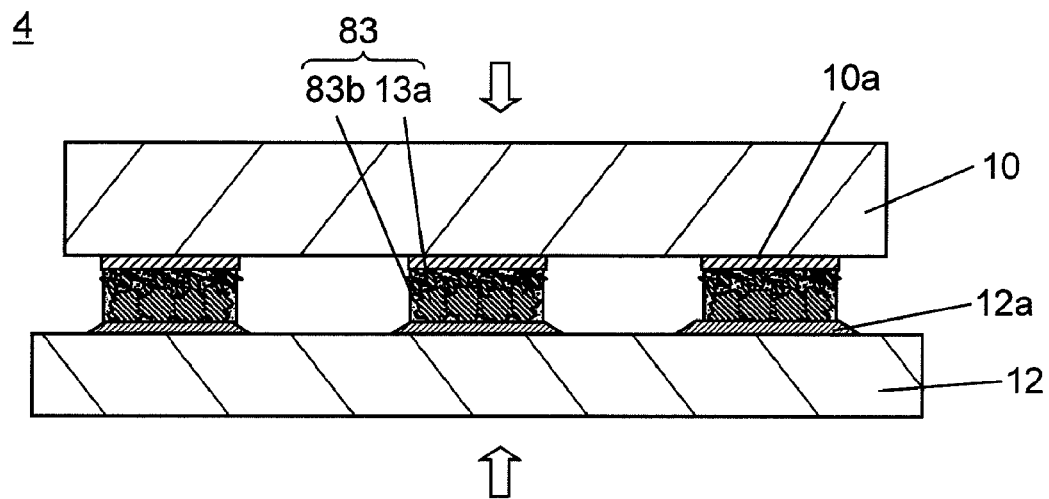
FIG. 8B is a conceptual cross-sectional view showing the configuration and manufacturing method for electronic component mounting structure in the fourth preferred embodiment of the present invention.

FIG. 8A and FIG. 8B are conceptual cross-sectional views showing the configuration and the manufacturing method for electronic component mounting structure in the fourth preferred embodiment of the present invention. Same component elements as in FIG. 1 are given same reference marks in the description.

That is, FIG. 8A and FIG. 8B are different from FIG. 1 in such point that the protrusion electrode is formed of a plurality of protrusion electrode portions.

As shown in FIG. 8A, protrusion electrode 83 is formed a plurality of protrusion electrode portion 830 on electrode terminals 10a of electronic component 10. And, each protrusion electrode portion 830 includes at least conductive filler 13a and photosensitive resin 83b, and is formed from, for example, photosensitive resin 83b continuously varying from high resin component crosslink density portion 831a to low resin component crosslink density portion 831b in the height (connecting) direction. And, at low resin component crosslink density portion 831b at least, it is structurally porous so as to have voids between conductive fillers 13a.

In this configuration, since the connection is made by a plurality of protrusion electrode portions which are porous and flexible, defective connection hardly occurs and it is possible to make highly reliable connection. Further, due to the plurality of protrusion electrode portions, it is easy to deform with low pressing forces in press-fitting operation, and because of press-fitting with low pressing forces, it is possible to obtain an electronic component mounting structure is rather free from breakdown of the electronic component or characteristic change and capable of assuring excellent reliability.

The manufacturing method for electronic component mounting structure in the fourth preferred embodiment of the present invention will be described in the following by using FIG. 8A and FIG. 8B. First, the protrusion electrode forming step is described with reference to FIG. 8A.

As shown in FIG. 8A, protrusion electrode 83 is formed on electrode terminal 10a of electronic component 10, arranging at least two pieces of protrusion electrode portions 830, four pieces as shown in the figure, within the region of one electrode terminal 10a of electronic component 10. The forming method is same as in the first preferred embodiment, and the description is omitted. In this case, protrusion electrode portion 830 is formed of at least conductive filler 13a and photosensitive resin 83b, and photosensitive resin 83b is continuously varied from high resin component crosslink density portion 831a to porous and low resin component crosslink density portion 831b.

And, electrode terminal 10a of electronic component 10 and connector terminal 12a of mounting substrate 12 are faced and positioned to each other via protrusion electrode 83 formed of a plurality of protrusion electrode portions 830.

Next, as shown in FIG. 8B, same as the connecting step in the first preferred embodiment, at least one of electronic component 10 with protrusion electrode 83 formed on electrode terminal 10a and mounting substrate 12 is press-fitted and heated. In this way, electrode terminal 10a is connected to connector terminal 12a via protrusion electrode 83, thereby manufacturing electronic component mounting structure 4.

According to this preferred embodiment, it is possible to realize the connection with lower pressing forces because of the plurality of protrusion electrode portions being structurally porous and flexible.

Fifth Preferred Embodiment

Figure 9A:
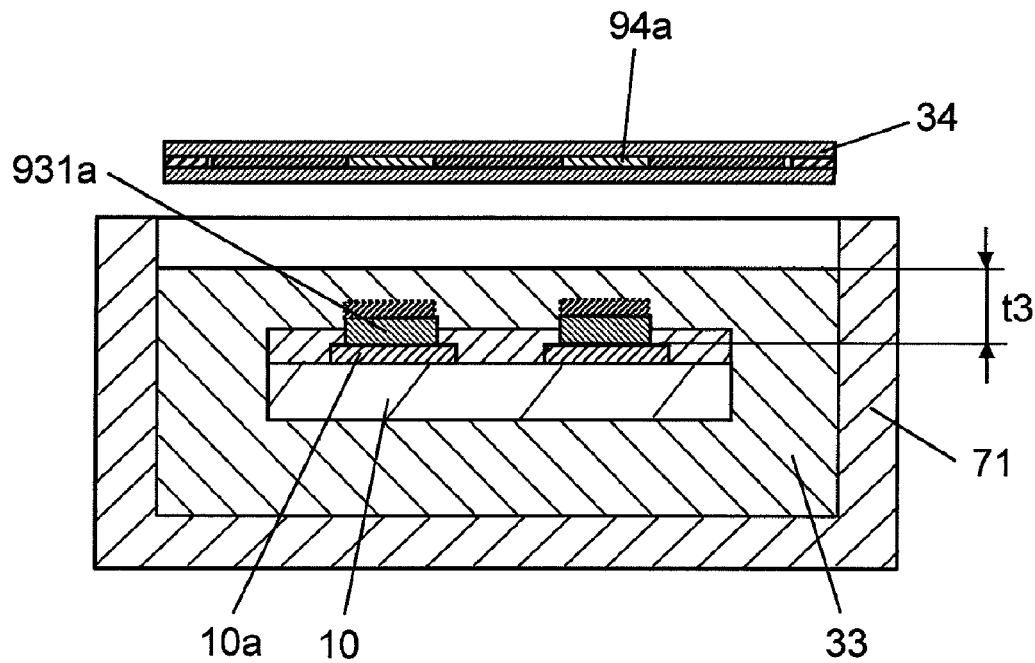
FIG. 9A is a conceptual cross-sectional view showing a manufacturing method for electronic component mounting structure in a fifth preferred embodiment of the present invention.
Figure 9B:
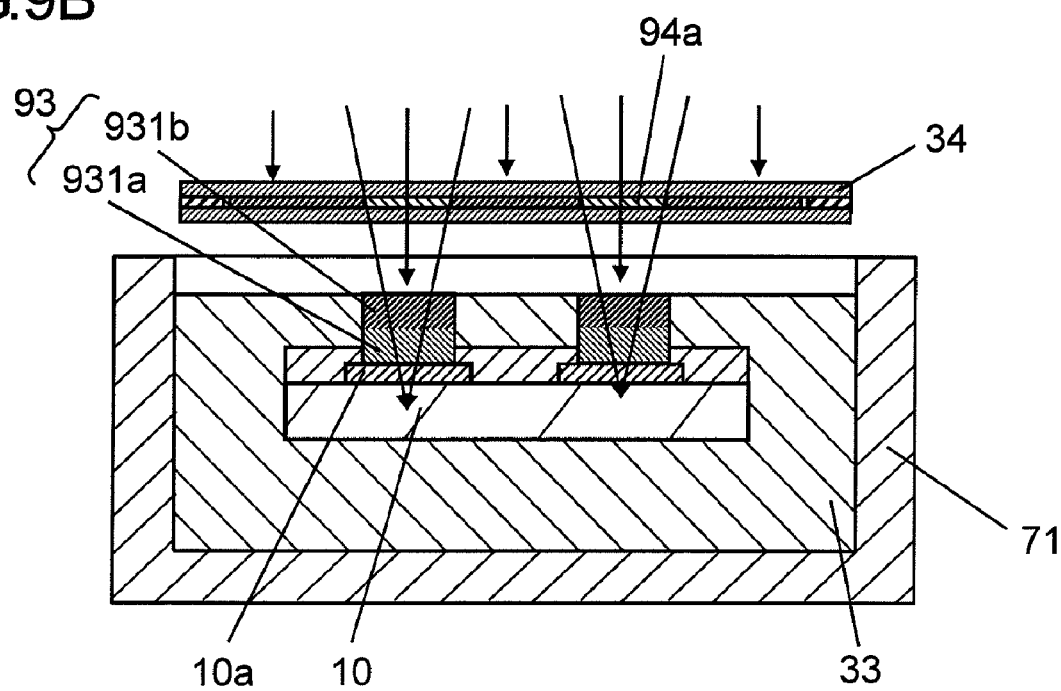
FIG. 9B is a conceptual cross-sectional view showing the manufacturing method for electronic component mounting structure in the fifth preferred embodiment of the present invention.

FIG. 9A and FIG. 9B are conceptual cross-sectional views showing the manufacturing method for electronic component mounting structure in the fifth preferred embodiment of the present invention. Same component elements as in FIG. 7A to FIG. 7C are given same reference marks in the description.

That is, FIG. 9A and FIG. 9B are different from FIG. 7A to FIG. 7C in such point that in the protrusion electrode forming step, the light collected at the focus position via the opening of photo-mask is applied to the photosensitive resin in the height direction of protrusion electrode so that it is formed varying in polymerization degree of photosensitive resin in the height direction of protrusion electrode.

First, as shown in FIG. 9A, photosensitive resin liquid 33 formed from photosensitive epoxy resin liquid, for example, including conductive filler (not shown) such as 90% by weight of Sn—Ag—In solder alloy particles, is supplied into container 71. And, electrode terminal 10a of electronic component 10 disposed at a stage (not shown) is immersed in photosensitive resin liquid 33 up to the position of predetermined interval t3 corresponding to the height of protrusion electrode from the liquid surface of photosensitive resin liquid 33.

In the above condition, as shown in FIG. 9B, for example, visible light is collected by means of an optical system so that the light is focused in the vicinity of the central portion of thickness of the electronic component in container 71 via opening 94a formed in the liquid crystal panel, photo-mask 34, from the liquid surface side of photosensitive resin liquid 33. It can be performed, for example, by shifting the focus position by using a method of reduced exposure or the like. And, visible light with constant light energy (having energy equivalent to 70% to 100% curing of photosensitive resin liquid) is applied for executing the exposure, and thereby, protrusion electrodes varying in polymerization degree of photosensitive resin in the direction of height (thickness) are formed all together on a plurality of electrode terminals 10a.

In this case, the photosensitive resin near the focus which forms the protrusion electrode is greater in polymerization degree because of high density of the light energy, and gradually decreases in polymerization degree as it comes apart from the focus.

Accordingly, for example, at electrode terminal 10a of electronic component 10, protrusion electrode 93 formed includes portions ranging from photosensitive resin portion of high polymerization degree 931a to photosensitive resin portion of low polymerization degree 931b.

Next, it is not shown but same as in the first preferred embodiment, protrusion electrode 93 continuously varying in resin component crosslink density of photosensitive resin in the direction of height is formed on electrode terminal 10a. In this case, at least in the vicinity of photosensitive resin portion of low polymerization degree 931b, voids are formed between conductive fillers due to volatilization, creating a porous structure.

And, according to the connecting step same as in the first preferred embodiment, an electronic component mounting structure is manufactured by connecting electrode terminal 10a to connector terminal 12a via protrusion electrode 93.

In the present preferred embodiment, with the position of electronic component fixed, the resin component crosslink density of photosensitive resin can be continuously formed in the height direction of protrusion electrode. Accordingly, it is possible to simplify the manufacturing equipment and to manufacture the electronic component mounting structure at low costs.

Sixth Preferred Embodiment

Figure 10A:
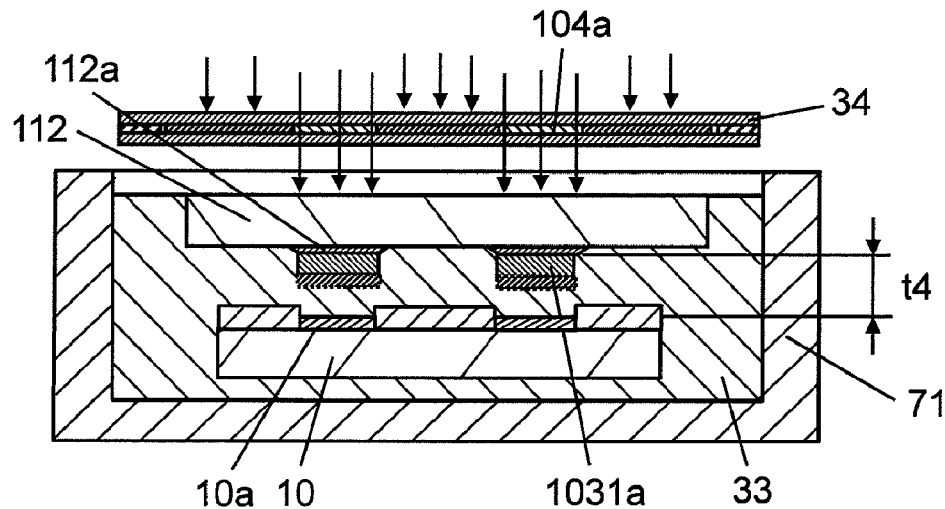
FIG. 10A is a conceptual cross-sectional view showing a manufacturing method for electronic component mounting structure in a sixth preferred embodiment of the present invention.
Figure 10B:
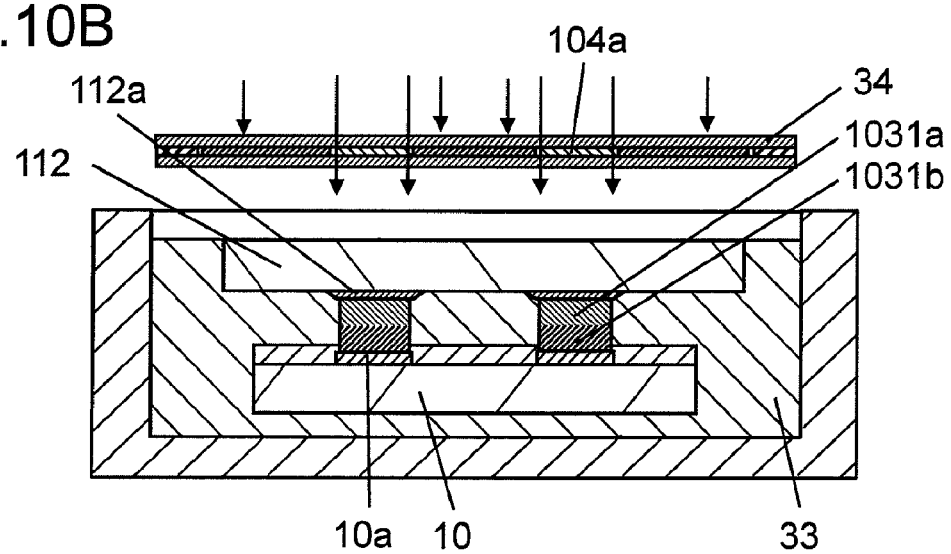
FIG. 10B is a conceptual cross-sectional view showing the manufacturing method for electronic component mounting structure in the sixth preferred embodiment of the present invention.
Figure 10C:
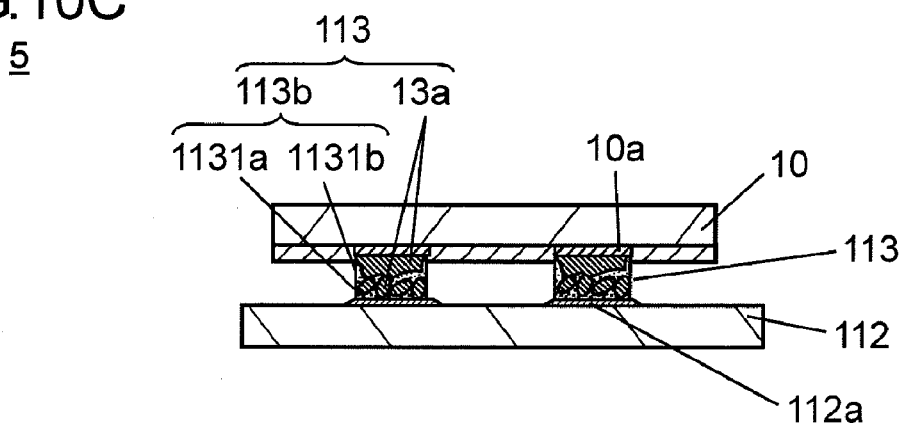
FIG. 10C is a conceptual cross-sectional view showing the manufacturing method for electronic component mounting structure in the sixth preferred embodiment of the present invention.

FIG. 10A to FIG. 10C are conceptual cross-sectional views showing the manufacturing method for electronic component mounting structure in the sixth preferred embodiment of the present invention. Same component elements as in FIG. 7A to FIG. 7C are given same reference marks in the description.

That is, FIG. 10A to FIG. 10C are different from each of the above preferred embodiments in such point that a mounting substrate including connector terminals formed from transparent conductive film formed on the surface of transparent material and an electronic component with electrode terminals disposed at positions corresponding to the connector terminals are arranged at a predetermined interval, and photosensitive resin including conductive filler is supplied between the electronic component and the mounting substrate, and light applied thereto while changing the light intensity from the side opposite to the side facing to the electronic component of the mounting substrate via the opening of the photo-mask in order to form a protrusion electrode varying in polymerization degree of photosensitive resin in the direction of height between connector terminal and electrode terminal. The following connecting step is same as in each of the above preferred embodiments, and the description is omitted.

First, as shown in FIG. 10A, as a mounting substrate is, for example, a transparent material such as glass substrate, and transparent mounting substrate 112 including connector terminal 112a formed from transparent conductive film such as ITO, which is formed on the surface thereof, is used.

And, connector terminal 112a of mounting substrate 112, and electrode terminal 10a of electronic component 10 disposed in a position corresponding thereto are arranged at predetermined interval t4 via a stage (not shown), and immersed in photosensitive resin liquid 33 including conductive filler at least between electronic component 10 and mounting substrate 112.

Further, visible light is applied while changing the light intensity, for example, from the side opposite to the side facing to electronic component 10 of transparent mounting substrate 112 via opening 104a of photo-mask 34 formed of a liquid crystal panel for the purpose of executing the light to photosensitive resin liquid 33. In this case, out of photosensitive resin liquid 33 between connector terminal 112a and electrode terminal 10a, photosensitive resin liquid 33 on connector terminal 112a is polymerized, resulting in growth of the region gradually polymerized in the direction of height. However, because the photosensitive resin includes conductive filler, in case of constant light energy, the growth of the region polymerized in the direction of height is delayed. For example, when the interval between connector terminal 112a and electrode terminal 10a is very wide, there arises a problem that it is unable to make the connection because protrusion electrodes are not formed.

Therefore, as shown in FIG. 10B, the light is applied to photosensitive resin liquid 33, while gradually increasing the light intensity, via opening 104a of photo-mask 34, polymerizing the photosensitive resin liquid up to the interface of electrode terminal 10a in the direction of height, in order to form protrusion electrodes. In this case, same as in the first preferred embodiment, protrusion electrodes varying in polymerization degree of photosensitive resin are formed in a range from the connector terminal of mounting substrate to the electrode terminal of electronic component.

Next, it is not shown but unexposed portion of photosensitive resin liquid 33 including conductive filler is removed through development.

Next, it is not shown but same as in the step of FIG. 5C, photosensitive resin 113b varying in polymerization degree in the direction of height including conductive filler 13a is heated at about 100° C., and volatile components such as reactive diluent and solvent contained therein are volatilized. In this case, due to difference in polymerization degree, photosensitive resin portion of high polymerization degree 1031a and photosensitive resin portion of low polymerization degree 1031b are different from each other in the polymerizing amounts of resin component and volatile component. As a result, protrusion electrode 113 formed of high resin component crosslink density portion 1131a and low resin component crosslink density portion 1131b of photosensitive resin 113b is formed between electrode terminal 10a and connector terminal 112a. And, at least in the vicinity of low resin component crosslink density portion 1131b, it becomes porous with voids formed between conductive fillers due to volatilization.

Next, as shown in FIG. 10C, according to the connecting step same as in the second preferred embodiment, electrode terminal 10a and connector terminal 112a are connected to each other via protrusion electrode 113 to manufacture electronic component mounting structure 5. In this case, porous and low resin component crosslink density portion 1131b of protrusion electrode 113 is soldered in a fusion-adhering fashion to the interface of electrode terminal 10a as a result of fusion-adhering of conductive fillers. On the other hand, high resin component crosslink density portion 1131a of connector terminal 112a is connected to protrusion electrode 113 as a result of contacting or partial fusion-adhering.

According to the present preferred embodiment, the mounting substrate can be connected to the electronic component at the same time when the protrusion electrode is formed, and it ensures excellent productivity. Also, since no variation in height of protrusion electrodes is generated, the connection can be made with less pressing forces in press-fitting operation.

In each of the above preferred embodiments, a photo-mask formed of a liquid crystal panel is used in the example described, but the configuration is not limited by this description. For example, it is allowable to replace the photo-mask having a fixed opening with a photo-mask having an opening of different shape in the manufacture. In this case, an additional step such as photo-mask replacement is required, but similar exposure can be realized by using a simple method.

Also, in each of the above preferred embodiments, the light is applied by using a photo-mask in the example described, but the configuration is not limited by this description. For example, it is allowable to apply the light to a predetermined region by laser scanning.

Seventh Preferred Embodiment

The structure of a protrusion electrode in the seventh preferred embodiment of the present invention will be described in the following by using FIG. 11. The protrusion electrode in this preferred embodiment can be used same as for the electronic component mounting structure in the first preferred embodiment to the sixth preferred embodiment. Accordingly, the structure of a protrusion electrode disposed on connector terminal of mounting substrate such as circuit board in particular is described in detail in the following, and same holds true for an electrode terminal of electronic component such as semiconductor. Also, other component elements of electronic component mounting structures other than those connected via protrusion electrodes of the present preferred embodiment are same as described above, and the description is omitted.

Figure 11:
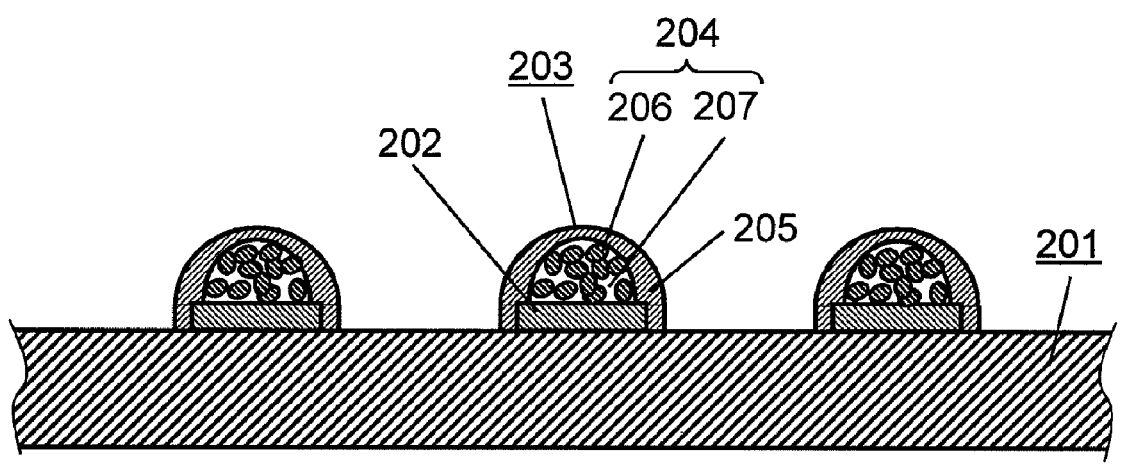
FIG. 11 is a cross-sectional view showing the structure of a conductive bump in a seventh preferred embodiment of the present invention.

FIG. 11 is a cross-sectional view showing the structure of a protrusion electrode in the seventh preferred embodiment of the present invention.

As shown in FIG. 11, protrusion electrode 203 is formed on connector terminal 202 disposed on the surface of mounting substrate 201 such as a glass epoxy substrate. In this case, connector terminal 202 is formed by coating 0.1 μm to 0.3 μm Au on the surface of Cu for example or by pre-coating solder on the surface of Cu.

And, protrusion electrode 203 is formed of conductive post 204 having flexibility and including at least conductive filler 206 such as solder particles and photosensitive resin 207, and conductive metal layer 205 that is a conductive film where the surfaces of conductive post 204 and connector terminal 202 is covered by molten conductive filler 206.

Since conductive post 204 is formed of conductive filler 206 and photosensitive resin 207, it is lower in elastic modulus and higher in flexibility as compared with solder bump or gold bump. For example, the dynamic hardness of gold bump is 60 to 90, while the dynamic hardness of protrusion electrode in this preferred embodiment is about 5 to 30. And, the dynamic hardness of protrusion electrode can be properly set in accordance with the material composition of conductive filler 206 and photosensitive resin 207, mixing rates, levels of curing light and time. Also, high conductivity can be obtained by conductive metal layer 205 which covers protrusion electrode 203. The thickness of conductive metal layer 205 is optional, but the thickness is preferable to be about 0.1 μm to 5 μm for example with which the flexibility of conductive post 204 can be assured.

Figure 12A:
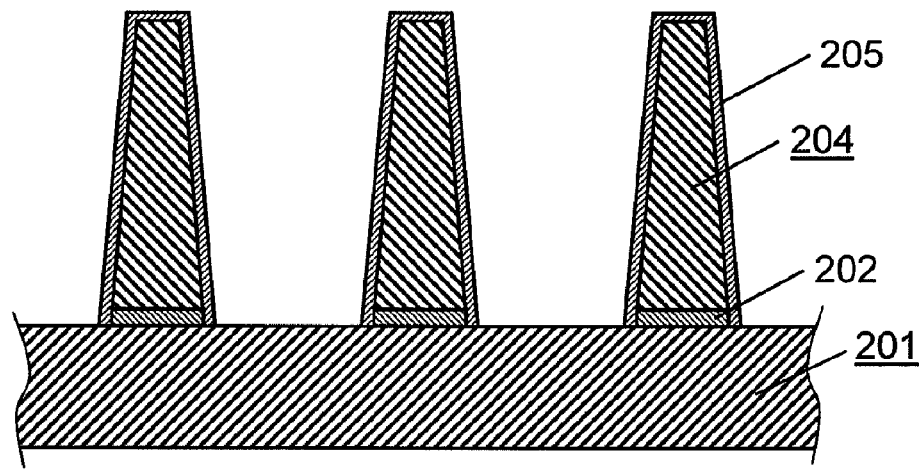
FIG. 12A is a cross-sectional view showing the structure of the conductive bump in the seventh preferred embodiment of the present invention.
Figure 12B:
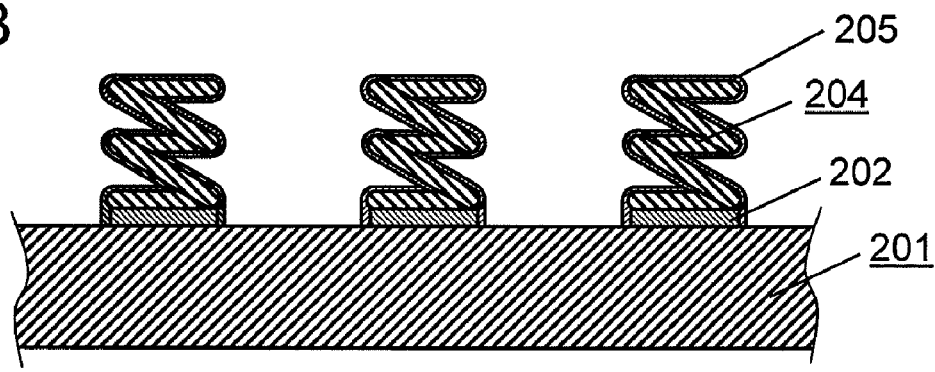
FIG. 12B is a cross-sectional view showing another example of structure of the conductive bump in the seventh preferred embodiment of the present invention.
Figure 12C:
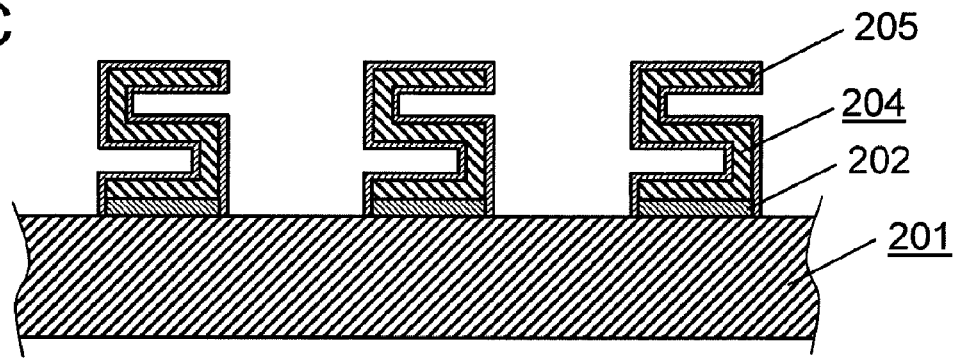
FIG. 12C is a cross-sectional view showing another example of structure of the conductive bump in the seventh preferred embodiment of the present invention.

In FIG. 11, protrusion electrode 203 having a hemispherical cross-sectional view is described in the example, but as described in detail in the following with respect to the forming method, conductive post 204 can be formed by a stereolithography method, and therefore, it can be formed in optional shape. For example, as shown in FIG. 12A to FIG. 12C, it can be formed in high-aspect shape, spiral shape, or shape of U shaped stack.

Accordingly, when an electronic component mounting structure is formed by mounting semiconductor elements (not shown) on mounting substrate 201 equipped with protrusion electrode 203 in the present preferred embodiment, due to the flexibility of conductive post 204 and conductive metal layer 205, pressing forces are absorbed in press-fitting operation and it is possible to execute the mounting with low pressing forces. Consequently, it is possible to efficiently execute the mounting, preventing breakdown of mounting substrate 201 and semiconductors. Further, variation in height of protrusion electrode 203 due to warp or deformation of mounting substrate 201 can be absorbed by the deformation of protrusion electrode 203, and it is possible to assure excellent connection reliability.

The forming method for protrusion electrode in the present preferred embodiment will be described in the following with reference to FIG. 13A to FIG. 16C.

First, the outline of the forming method for protrusion electrode is described by using FIG. 13A to FIG. 13D. The forming method for conductive post in FIG. 14A and FIG. 14B, the forming method for conductive metal layer in FIG. 15A to FIG. 15C, and the removing method for conductive paste remaining in FIG. 16A to FIG. 16C are described in detail.

FIG. 13A to FIG. 13D are schematic cross-sectional views showing the forming method for protrusion electrode 203.

Figure 13A:
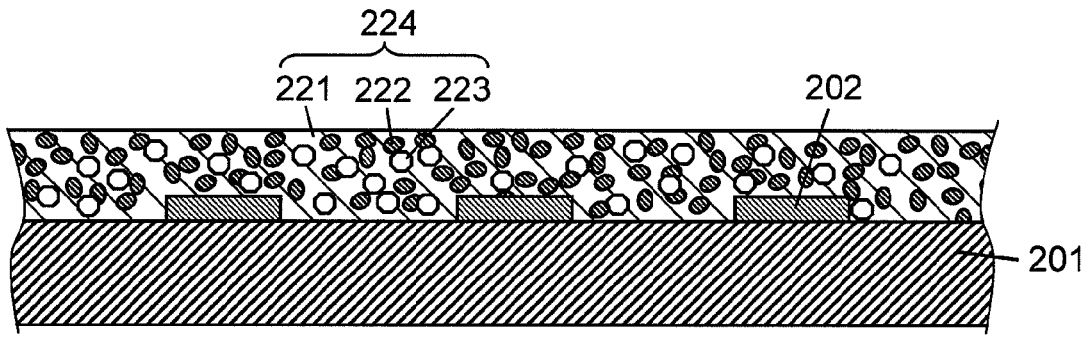
FIG. 13A is a schematic cross-sectional view showing the method of forming the conductive bump in the seventh preferred embodiment of the present invention.

As shown in FIG. 13A, photosensitive resin 221 as a binder and photosensitive conductive resin composition (hereinafter called conductive paste) 224 based on conductive filler 222 formed of solder particles for example and further containing convection generator agent 223 are placed on the surface of mounting substrate 201 provided with a plurality of connector terminals 202.

Figure 13B:
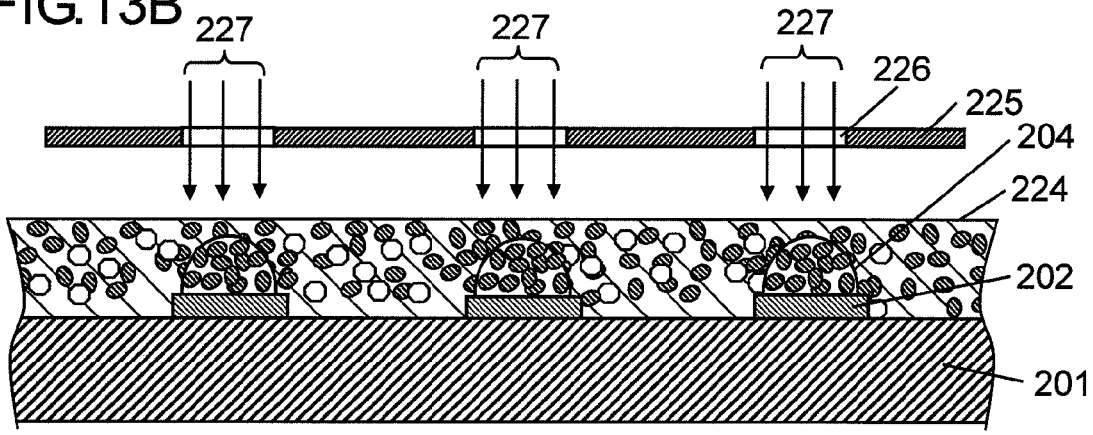
FIG. 13B is a schematic cross-sectional view showing the method of forming the conductive bump in the seventh preferred embodiment of the present invention.

Subsequently, as shown in FIG. 13B, conductive post 204 is formed by using a stereolithography method described in the following. That is, liquid crystal mask 225 is arranged in a position faced to conductive paste 224, and opening 226 of liquid crystal mask 225 is adjusted to the position corresponding to connector terminal 202 of mounting substrate 201. And, for example, ultraviolet light 227 is applied to conductive paste 224 as shown by the arrow mark in the figure via opening 226 of liquid crystal mask 225, and photosensitive resin 221 in conductive paste 224 is sequentially cured on connector terminals 202 to form conductive post 204. In this case, generally, the outer surface of conductive post 204 is formed with conductive filler 222 in a state of being exposed or covered with thin film of photosensitive resin 221.

Figure 13C:
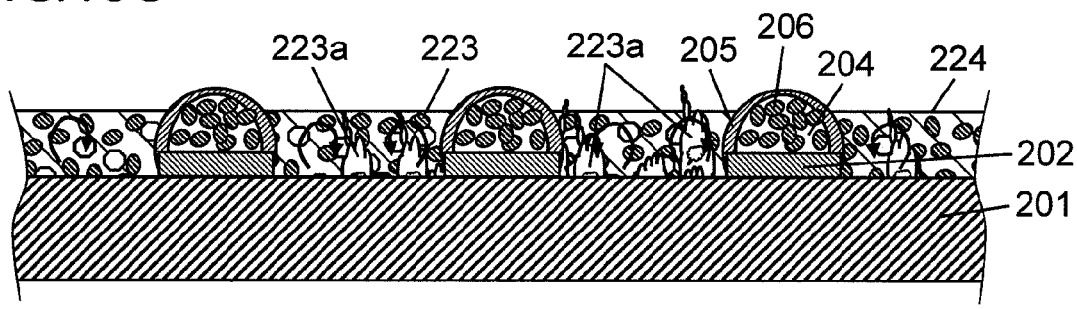
FIG. 13C is a schematic cross-sectional view showing the method of forming the conductive bump in the seventh preferred embodiment of the present invention.

Next, as shown in FIG. 13C, mounting substrate 201 is heated at temperatures of about 150° C. for example at which conductive filler 222 is melted. In this case, convection generator agent 223 added into conductive paste 224 is boiled or decomposed to generate gas 223a.

And, as the temperature increases, conductive paste 224 lowers in viscosity, and due to gas 223a generated with convention generator 223 boiled or decomposed, convection is generated in conductive paste 224 as shown by the arrow mark in the figure. In this case, the kinetic energy produced by convection causes the flow of conductive paste 224 to be promoted, and melted conductive filler 222 is self-aggregated via conductive filler 206 around conductive post 204 formed on connector terminal 202. In this way, conductive metal layer 205 formed from solder is formed and grows while coming into wet contact with conductive filler 206 exposed at the surface of conductive post 204. As a result, protrusion electrode 203 having conductive metal layer 205 is formed on the outer surface at least of conductive post 204. It is not formed only on the outer surface of conductive post 204, but for example convection generator agent 223 taken into conductive post 204 is heated and gas release hole or the like is formed in conductive post 204, and a conductive metal layer is sometimes formed in the gas release hole.

In that case, the conductive fillers not concerned in forming the conductive metal layer, in other region than the electrode terminal of mounting substrate, are less wettable with the resist that covers other circuit board than the electrode terminal, and therefore, the conductive fillers combine with each other due to surface tension and sometimes remain in the conductive paste, having certain sizes.

Figure 13D:
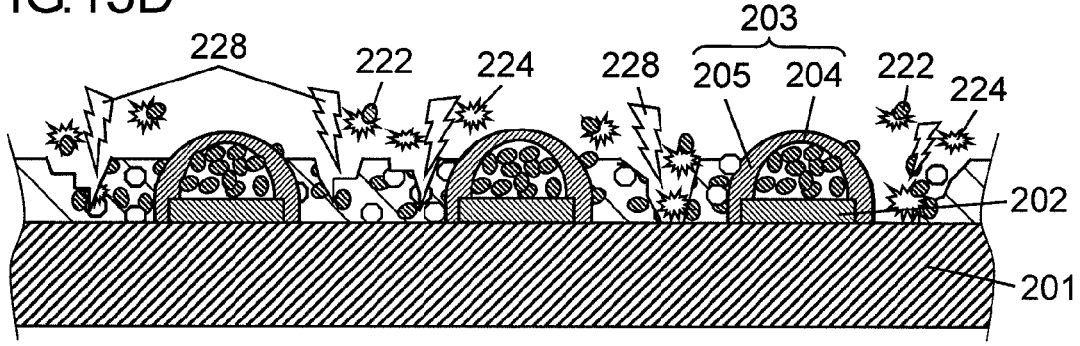
FIG. 13D is a schematic cross-sectional view showing the method of forming the conductive bump in the seventh preferred embodiment of the present invention.

As shown in FIG. 13D, after growth of conductive metal layer 205 up to the necessary thickness of about 1 μm, conductive paste 224 remaining on mounting substrate 201 other than protrusion electrode 203 is removed for example by using a dry ice (trademark of Dry Ice Corporation) cleaning method. The dry ice cleaning method is described in detail by using FIG. 16A to FIG. 16C, in which for example powder-form dry ice 228 is bumped against conductive paste 224 to remove the paste.

According to the above steps, protrusion electrode 203 formed of conductive post 204 and conductive metal layer 205 shown in FIG. 11 is formed on connector terminal 202 on mounting substrate 201.

Then, the material shown in the preferred embodiment 1 is used as conductive filler 206, 222. Also, wax, isopropyl alcohol, butyl carbitol, butyl carbitol acetate, α-terpineol, and ethylene glycol can be used as convection generator agent 223. Further, dawsonite, metabolic acid ammonium, sodium hydrogen carbonate, and boric acid can be used as decomposition type gas generator which generates gas through decomposition in heating.

Figure 14A:
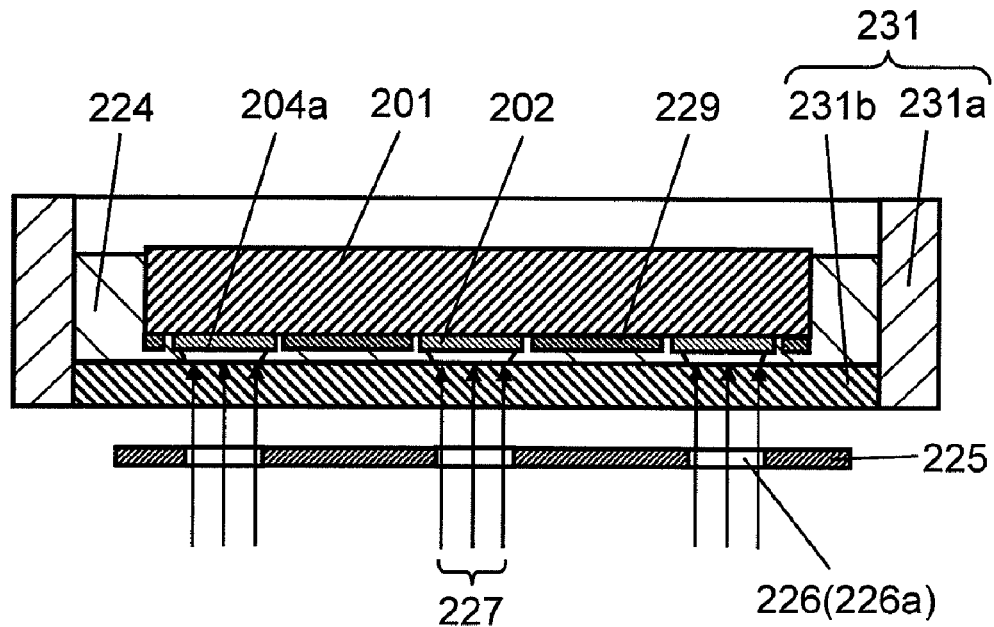
FIG. 14A is a cross-sectional view showing the method of forming a conductive post in the seventh preferred embodiment of the present invention.
Figure 14B:
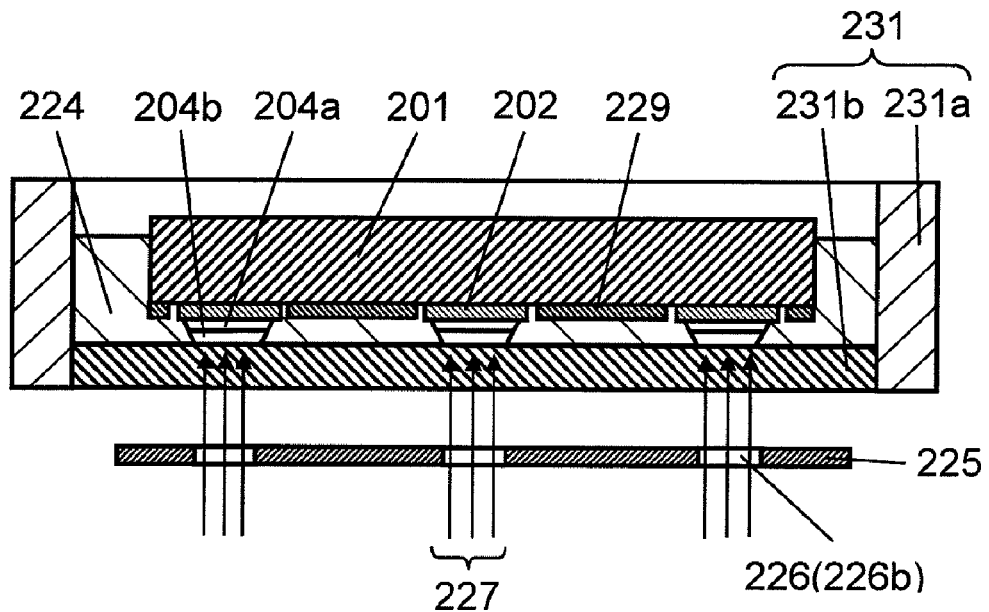
FIG. 14B is a cross-sectional view showing the method of forming the conductive post in the seventh preferred embodiment of the present invention.

The method of forming conductive post 204 of protrusion electrode 203 in the seventh preferred embodiment of the present invention will be described in detail in the following with reference to FIG. 14A and FIG. 14B. In FIG. 14A and FIG. 14B, same portions as in FIG. 13A to FIG. 13D are given same reference marks in the description.

As shown in FIG. 14A, for example, conductive paste 224 is put into container 231 formed of peripheral wall 231a and bottom portion 231b up to a height such that at least the surface of connector terminal 202 of mounting substrate 201 is immersed therein. Bottom portion 231b of container 231 is formed from a transparent material such as quartz which allows the transmission of ultraviolet light 227 for curing conductive paste 224.

Next, liquid crystal mask 225 having opening 226 formed so as to correspond to connector terminal 202 of mounting substrate 201 is arranged under the bottom portion 231b of container 231. In this condition, ultraviolet light 227 is applied to conductive paste 224 on connector terminal 202 from bottom portion 231b via opening 226 of liquid crystal mask 225.

And, conductive paste 224 between connector terminal 202 and bottom portion 231b is cured by ultraviolet light 227 passing through opening 226a with the illumination started. Then, the stage (not shown) provided with mounting substrate 201 is lifted up and continuously narrow the opening 226 of liquid crystal mask 225 for example, and thereby, cured portion 204a having a rectangular shape is formed.

Subsequently, as shown in FIG. 14B, mounting substrate 201 during application of ultraviolet light 227 is lifted up and continuously narrow the opening of liquid crystal mask 225 the same as for opening 226b. And, cured portion 204b having rectangular cross-sectional view is stacked and cured to form conductive post 204 of hemispherical shape for example as shown in FIG. 11.

The shape of conductive post 204 can be adjusted for example by controlling the lifting speed of mounting substrate 201 and the area of opening 226, that is, by properly adjusting the aspect ratio and shape of conductive post 204 as shown in FIG. 12A to FIG. 12C. In this way, it is possible to form the conductive post 204 in proper shape such as cylindrical, conical, or square columnar. In this case, the shape and area of opening 226 can be electrically controlled by regulating the voltage applied to the liquid crystal mask formed of a plurality of liquid crystal cells formed in a matrix fashion.

Also, at the opening of the liquid crystal mask, by using the display gray scale (e.g. 256 gray scales) of the liquid crystal, the end area of the conductive post can be sharpened by decreasing surplus growth due to scattered light.

Also, in the present preferred embodiment, protective layer 229 is formed by resist for example on surfaces except connector terminal 202 of mounting substrate 201, but even in case the layer is not formed, conductive post 204 can be similarly formed.

The method of forming conductive metal layer 205 on the surface of conductive post 204 formed by a stereolithography method will be described in detail in the following by using FIG. 15A to FIG. 15C.

Figure 15A:
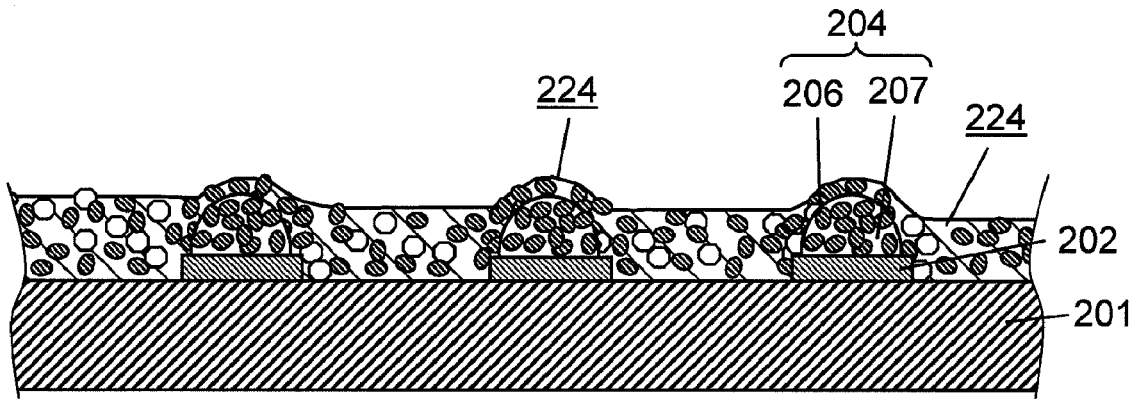
FIG. 15A is a cross-sectional view showing the method of forming a conductive metal layer in the seventh preferred embodiment of the present invention.
Figure 16A:
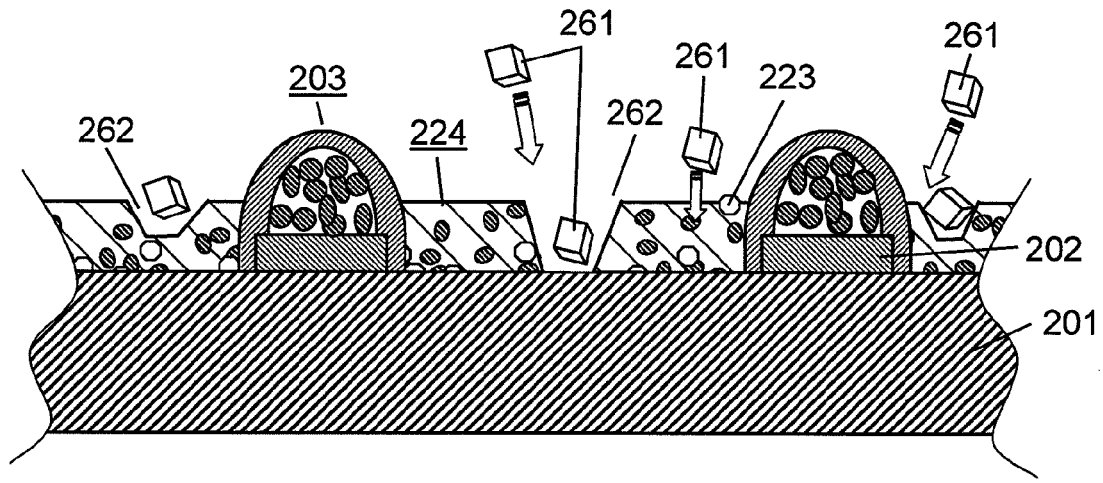
FIG. 16A is a schematic cross-sectional view showing a dry ice cleaning method in the seventh preferred embodiment of the present invention.
Figure 16B:
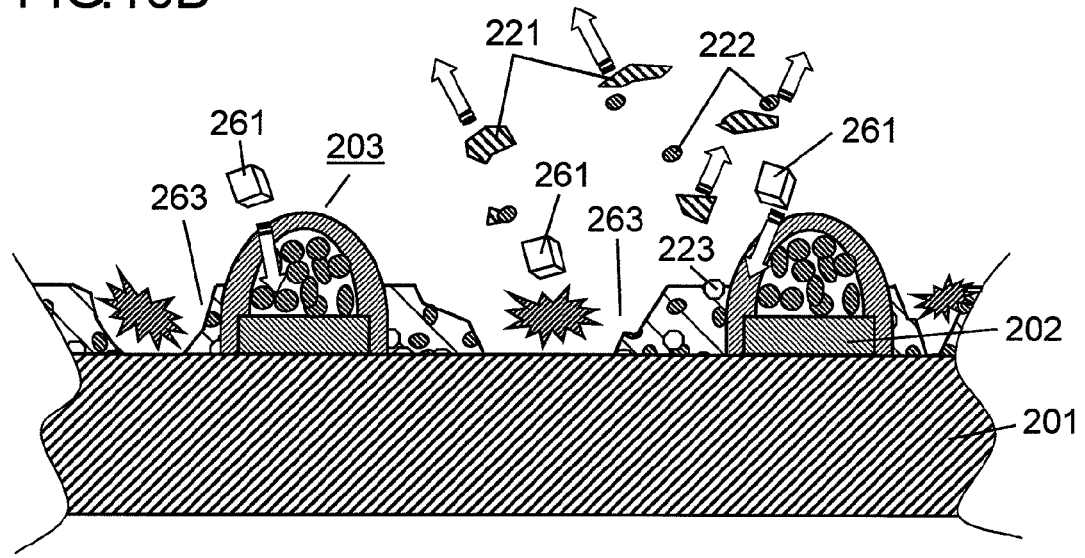
FIG. 16B is a schematic cross-sectional view showing the dry ice cleaning method in the seventh preferred embodiment of the present invention.
Figure 16C:
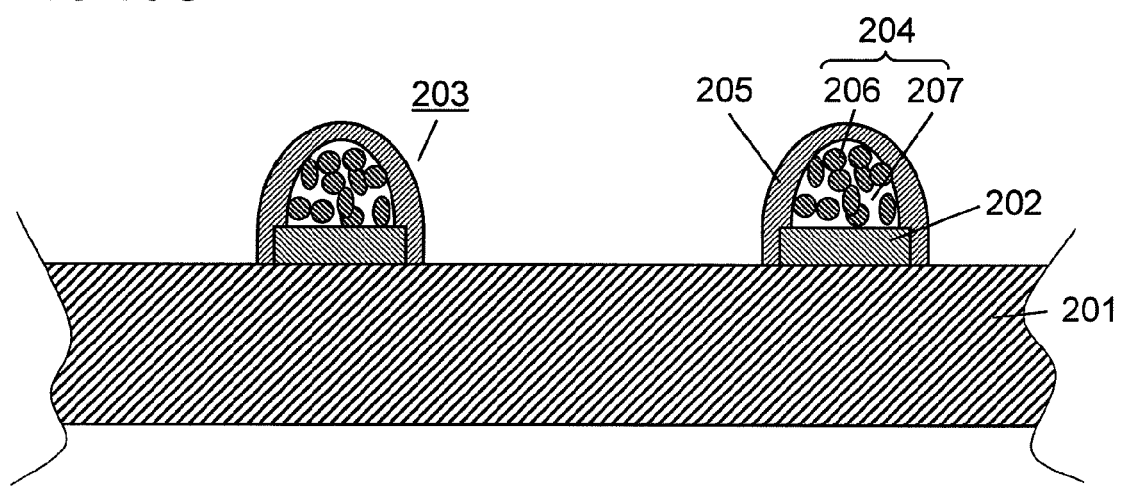
FIG. 16C is a schematic cross-sectional view showing the dry ice cleaning method in the seventh preferred embodiment of the present invention.

First, FIG. 15A shows a state such that mounting substrate 201 is taken out of container 231 with conductive paste 224 contained therein after forming conductive post 204 shown in FIG. 14C. In this case, in conductive post 204, conductive fillers 206 such as solder particles gather close together in photosensitive resin 207 cured by the ultraviolet light applied, which are solidified in a state of being partially in contact with each other, and also, some of conductive fillers 206 is exposed at the surface of conductive post 204. And, conductive paste 224 in the form of liquid is sticking to mounting substrate 201 and the outer surface of conductive post 204.

Figure 15B:
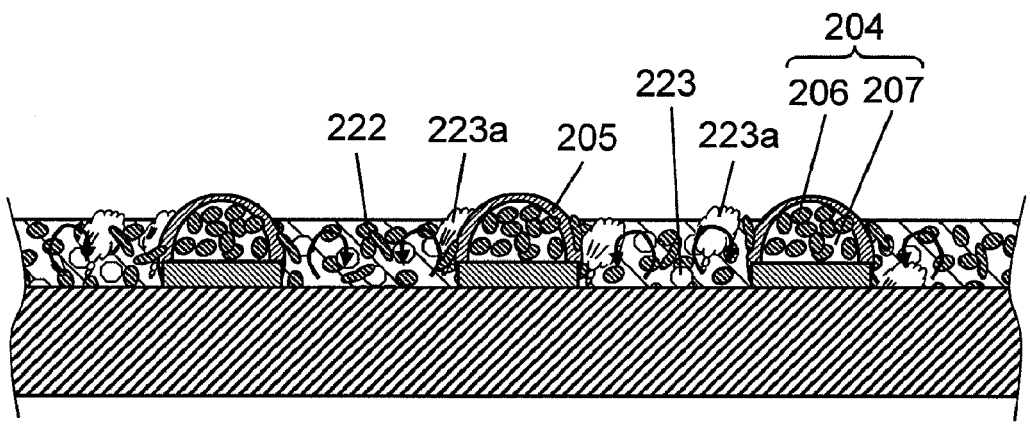
FIG. 15B is a cross-sectional view showing the method of forming the conductive metal layer in the seventh preferred embodiment of the present invention.

Next, as shown in FIG. 15B, mounting substrate 201 is heated up to the melting temperature of solder particles, conductive filler 206. In this way, the viscosity of conductive filler 222 in other region than conductive post 204 is lowered, causing conductive filler 206 in conductive paste 224 to flow. In addition, convection generator agent 223 in conductive paste 224 is boiled or decomposed, causing gas 223a to be generated. Consequently, convection is generated as shown by the arrow mark in the figure, and it causes conductive paste 224 to be agitated. And, due to the agitation and heat or the like, self-aggregation to the outer surface of conductive post 204 of conductive filler 222 in a state of being melted and flowing is promoted. In this case, conductive post 204 on mounting substrate 201 is formed in a state of being already solidified due to the application of light. Accordingly, the flow of melted conductive filler 222 is suppressed around conductive post 204. As a result, conductive filler 206 exposed at the surface of conductive post 204 catches conductive filler 222 to come in wet-contact with the melted filler. And, conductive metal layer 205 formed from solder is formed on the surface of conductive post 204. In this case, the temperature at which convection generator agent 223 is boiled or vaporized or the temperature at which it is decomposed to generate gas is desirable to be higher than the melting point of conductive filler such as solder particles.

Generated gas 223a is discharged out of conductive paste 224 after causing conductive paste 224 to flow. Accordingly, due to gas 223a taken into conductive post 204, a by-path for gas 223a is formed sometimes in conductive post 204.

Figure 15C:
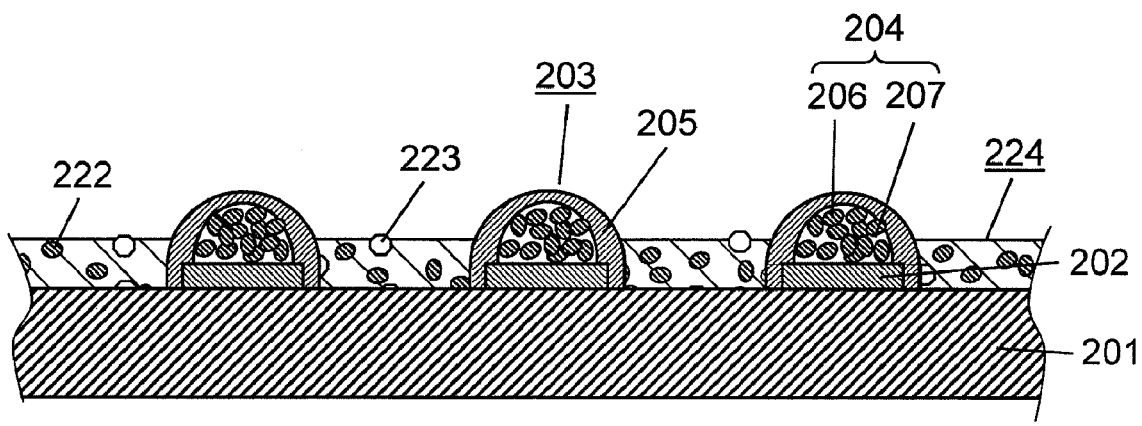
FIG. 15C is a cross-sectional view showing the method of forming the conductive metal layer in the seventh preferred embodiment of the present invention.

Next, as shown in FIG. 15C, with the heating step completed, protrusion electrode 203 with conductive post 204 covered with conductive metal layer 205 is formed on the surface of connector terminal 202 of mounting substrate 201. In this case, conductive paste 224 in a state of being cured or half-cured, with a part of conductive filler 222 remaining therein, remains on mounting substrate 201 except protrusion electrode 203.

And, conductive paste 224 remaining on mounting substrate 201 is removed by the dry ice cleaning method described in the following.

The dry ice cleaning method that is an example of removing the remaining conductive paste 224 will be described with reference to FIG. 16A to FIG. 16C.

FIG. 16A to FIG. 16C are schematic cross-sectional views showing the dry ice cleaning method.

First, as shown in FIG. 16A, dry ice 261 is sprayed onto the surface of mounting substrate 201 in order to remove the conductive paste remaining on surfaces other than protrusion electrode 203 formed on connector terminal 202 of mounting substrate 201. In this case, dry ice 261 is sprayed in the form of particles or pellets from a nozzle (not shown) by using compressed air, and it bumps against conductive paste 224. As a result, micro-crack 262 is created in conductive paste 224, and dry ice 261 intrudes into the interface between conductive paste 224 and mounting substrate 201. Then, the spray energy for example is adjusted so that dry ice 261 will not intrude into protrusion electrode 203, and also, the intrusion is prevented by conductive metal layer 205.

Next, as shown in FIG. 16B, dry ice 261 reaching the surface of mounting substrate 201 is vaporized and rapidly expanded. And, due to expansion 263, the component of photosensitive resin 221 of conductive paste 224 and conductive filler 222 formed of solder particles are removed and scattered from mounting substrate 201.

And, as shown in FIG. 16C, it is possible to manufacture mounting substrate 201 without conductive paste remaining in regions other than protrusion electrode 203.

According to this method, it is possible to execute cleaning between protrusion electrodes disposed at fine pitches, which has been difficult to execute by a conventional wet-cleaning method using solvent or a physical cleaning method using plasma. As a result, it is possible to manufacture mounting substrate 201 equipped with protrusion electrodes 203, which is effectively prevented from lowering of insulation resistance due to residue and from secular change.

Also, since the drying step in the conventional wet-cleaning method is not needed, the step can be simplified and it is possible to reduce the damage to semiconductor elements even in case of forming protrusion electrodes on semiconductor elements.

Besides compressed air, nitrogen gas or carbon dioxide gas can be used for the purpose of spraying dry ice.

In the present preferred embodiment, it is possible to execute curing reaction of conductive paste by application of ultraviolet light under a condition where no oxygen exists, and therefore, photosensitive resin which is liable to be quenched due to oxygen can be used.

Further, in the present preferred embodiment, conductive post 204 is formed on connector terminal 202 disposed on mounting substrate 201 as described, but the configuration is not limited by this description. For example, it is allowable to use semiconductor element in place of mounting substrate 201. In this case, it is allowable to form a plurality of semiconductors on a silicon substrate in a state of semiconductor wafer, which enables remarkable improvement of the productivity.

INDUSTRIAL APPLICABILITY

According to the electronic component mounting structure and its manufacturing method of the present invention, it is possible to make press-fitted connection with low pressing forces, and also, to form fine protrusion electrodes at narrow pitches. As a result, it is useful in the field of mounting electronic components of cellular phones, portable digital equipment, and digital household appliances which are required to be reduced in size including thickness.

The invention claimed is:

1. An electronic component mounting structure comprising:
   an electronic component provided with an electrode terminal; and
   a mounting substrate provided with a connector terminal which is positioned facing the electrode terminal,
   wherein the electrode terminal is connected to the connector terminal via a protrusion electrode disposed on the electrode terminal or the connector terminal, and
   wherein the protrusion electrode includes at least a conductive filler and a photosensitive resin, and
   wherein a resin component crosslink density of the photosensitive resin is lower on an electrode terminal side of the protrusion electrode than on a connector terminal side of the protrusion electrode.

2. The electronic component mounting structure of claim 1, wherein the conductive filler is subjected to fusion-adhering at a portion where the resin component crosslink density is low, and the conductive filler is subjected to contacting with each other at a portion where the resin component crosslink density is high, to make a connection between the electrode terminal and the connector terminal.

3. The electronic component mounting structure of claim 1, wherein the resin component crosslink density continuously varies in a height direction of the protrusion electrode.

4. The electronic component mounting structure of claim 1, wherein the protrusion electrode is formed of a plurality of layers different from each other in the resin component crosslink density of the photosensitive resin.

5. The electronic component mounting structure of claim 4, wherein thickness of a first layer at least being in contact with the electrode terminal with respect to the plurality of layers varies with positions of the electrode terminal.

6. The electronic component mounting structure of claim 1, wherein the protrusion electrode is formed of a plurality of protrusion electrode portions.

7. The electronic component mounting structure of claim 1, wherein the protrusion electrode is provided with conductive film on the surface thereof.

8. The electronic component mounting structure of claim 1, wherein the electronic component has a plurality of electrode terminals, and the mounting substrate has a plurality of connector terminals positioned facing the electrode terminals,
   wherein the electrode terminals are connected to the connector terminals, respectively, via protrusion electrodes, and each protrusion electrode is disposed on the respective electrode terminal or the respective connector terminal,
   wherein each protrusion electrode includes at least a conductive filler and a photosensitive resin, and wherein, in each protrusion electrode, a resin component crosslink density of the photosensitive resin is lower on the electrode terminal side of the protrusion electrode than on the connector terminal side of the protrusion electrode.

9. The electronic component mounting structure of claim 8, wherein the conductive filler of each protrusion electrode includes a plurality of particles, and
wherein, in each protrusion electrode, the particles are fusion-adhered to each other on the connector terminal side of the protrusion electrode and the particles contact each other on the electrode terminal side of the protrusion electrode.

10. The electronic component mounting structure of claim 1, wherein the conductive filler includes a plurality of particles, and
wherein the particles are fusion-adhered to each other on the connector terminal side of the protrusion electrode, and the particles contact each other on the electrode terminal side of the protrusion electrode.

* * * * *